United States Patent
Kitamura et al.

(10) Patent No.: US 11,981,033 B2
(45) Date of Patent: May 14, 2024

(54) DEVICE AND METHOD FOR DIAGNOSING FAILURE OF SPEED REDUCER

(71) Applicant: Kawasaki Jukogyo Kabushiki Kaisha, Kobe (JP)

(72) Inventors: Shinji Kitamura, Kobe (JP); Makoto Kawai, Kobe (JP); Tetsuo Kaneda, Kobe (JP); Tetsuya Taguchi, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 337 days.

(21) Appl. No.: 17/622,233

(22) PCT Filed: Jun. 24, 2020

(86) PCT No.: PCT/JP2020/024708
§ 371 (c)(1),
(2) Date: Dec. 23, 2021

(87) PCT Pub. No.: WO2020/262421
PCT Pub. Date: Dec. 30, 2020

(65) Prior Publication Data
US 2022/0347849 A1 Nov. 3, 2022

(30) Foreign Application Priority Data
Jun. 28, 2019 (JP) .................. 2019-121889

(51) Int. Cl.
B25J 9/16 (2006.01)
B25J 19/06 (2006.01)
(Continued)

(52) U.S. Cl.
CPC ............ B25J 9/1674 (2013.01); B25J 19/06 (2013.01); G01M 13/021 (2013.01); G01R 31/343 (2013.01)

(58) Field of Classification Search
CPC ...... B25J 9/1674; B25J 19/06; G01M 13/021; G01R 31/343; G05B 2219/37209
(Continued)

(56) References Cited

U.S. PATENT DOCUMENTS 5,566,092 A * 10/1996 Wang ................. G05B 19/4184
706/912
2017/0087719 A1 3/2017 Tsuchiya
2019/0339161 A1 11/2019 Taguchi et al.

FOREIGN PATENT DOCUMENTS

JP 2017-061001 A 3/2017
JP 6144404 B1 6/2017
(Continued)

Primary Examiner — David Luo
(74) Attorney, Agent, or Firm — XSENSUS LLP

(57) ABSTRACT

A failure diagnosing device diagnoses failure of a plurality of reduction gears of a mechanical apparatus which includes a plurality of operation parts, a plurality of motors, and the plurality of reduction gears. The failure diagnosing device includes an acceleration/deceleration period identifying module configured to identify an acceleration/deceleration period of operation of one of the plurality of operation parts, a motor current processing module configured to acquire a peak value of an amplitude of a frequency component of motor current in a specific frequency band of one motor that drives the one operation part, in the acceleration/deceleration period, and a determining module configured to determine whether a sign of failure exists in one of the reduction gears.

12 Claims, 13 Drawing Sheets

(51) Int. Cl.
*G01M 13/021* (2019.01)
*G01R 31/34* (2020.01)

(58) Field of Classification Search
USPC .......................... 318/568.11, 568.1, 567, 560
See application file for complete search history.

(56) References Cited

FOREIGN PATENT DOCUMENTS

| | | |
|---|---|---|
| JP | 2018-105782 A | 7/2018 |
| JP | 2018-202553 A | 12/2018 |

* cited by examiner (a)

(b)

| SPECIFIC FREQUENCY BAND | OSCILLATION OF ROBOT BODY | JOINT SUITABLE FOR FAILURE DIAGNOSIS |
|---|---|---|
| 1ST SPECIFIC FREQUENCY BAND fr1 | LATERAL OSCILLATION | 1ST JOINT |
| 2ND SPECIFIC FREQUENCY BAND fr2 | VERTICAL OSCILLATION | 2ND JOINT, 3RD JOINT |
FIG. 7
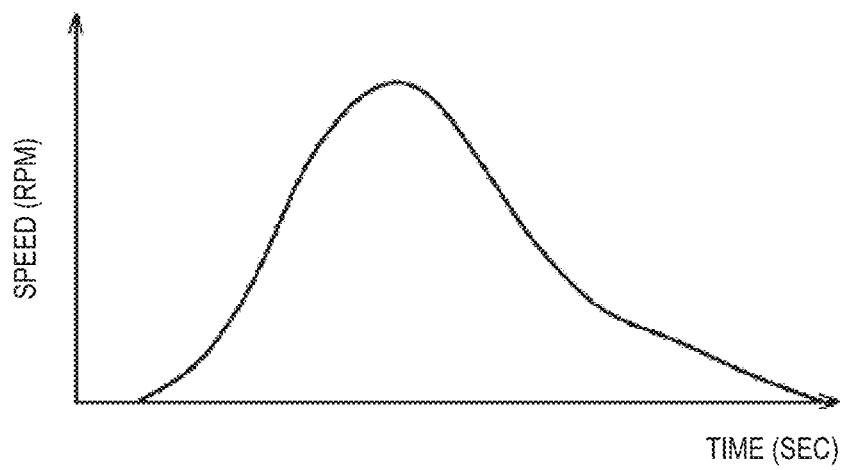
FIG. 8
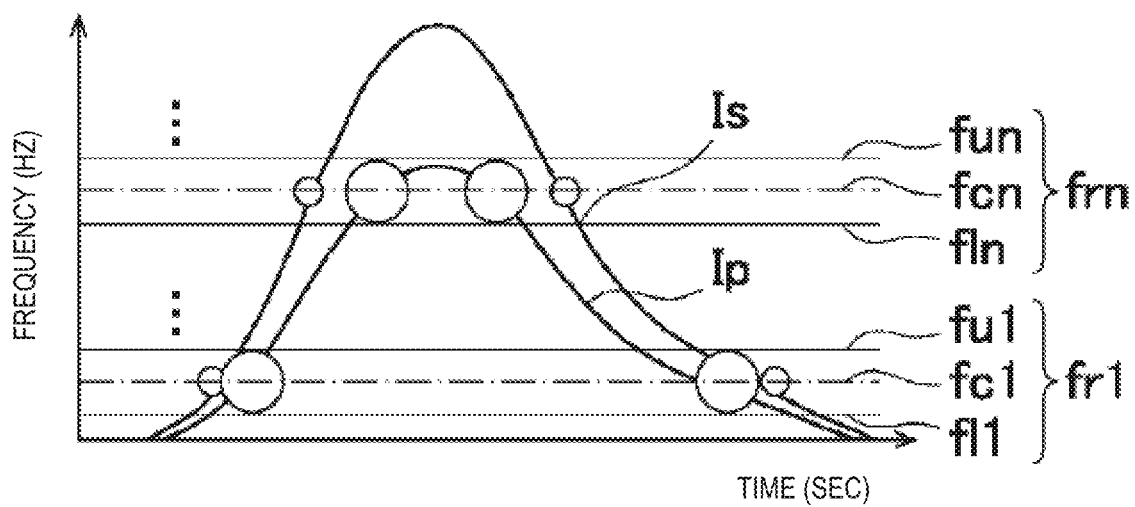
FIG. 9

DEVICE AND METHOD FOR DIAGNOSING FAILURE OF SPEED REDUCER

CROSS-REFERENCE TO RELATED APPLICATIONS

The present application is based on PCT filing PCT/JP2020/024708, filed Jun. 24, 2020, which claims priority to JP 2019-121889, filed Jun. 28, 2019, the entire contents of each are incorporated herein by reference.

TECHNICAL FIELD

The present disclosure relates to a device and a method for diagnosing failure of a reduction gear.

BACKGROUND ART

Conventionally, methods of diagnosing failure of a reduction gear are known, which determines whether a sign of failure exists in the reduction gear based on a change in a frequency spectrum of motor current in response to a change in a rotational speed of a motor during an acceleration/deceleration period of a mechanical apparatus (see Patent Document 1). Since this failure diagnosis method performs the failure diagnosis during the acceleration/deceleration period of the mechanical apparatus, it can perform the failure diagnosis during a work of the mechanical apparatus.

REFERENCE DOCUMENT OF CONVENTIONAL ART

Patent Document

[Patent Document 1] JP6144404B1

DESCRIPTION OF THE DISCLOSURE

Problem to be Solved by the Disclosure

Meanwhile, failure is desired to be found as early as possible. In the failure diagnosis method of the reduction gear as described above, in a state where wear of the reduction gear progresses to some extent, the motor current apparently increases, and thus, the existence of the sign of failure in the reduction gear can certainly be determined.

However, in a state where wear of the reduction gear is not so progressed, the motor current does not increase much, and thus, the increase in the motor current due to the wear of the reduction gear is buried by fluctuation of the motor current caused by other factors. Accordingly, it is not easy to determine at an early stage whether the reduction gear indicates a sign of failure.

The present disclosure is made in order to solve the problem described above, and one purpose thereof is to provide a device and a method for diagnosing failure of reduction gears, capable of determining existence of a sign of failure at an early stage.

Summary of the Disclosure

In order to achieve the purpose, a failure diagnosing device according to one aspect of the present disclosure diagnoses failure of a plurality of reduction gears provided to a mechanical apparatus including a plurality of operation parts, and a plurality of motors configured to drive the plurality of operation parts, respectively, the plurality of reduction gears being configured to reduce speeds of rotational forces of the plurality of motors and transmit the reduced rotational forces to the plurality of operation parts, respectively. The failure diagnosing device includes an acceleration/deceleration period identifying module configured to identify an acceleration/deceleration period of operation of one of the plurality of operation parts, a motor current processing module configured to process motor current to acquire a peak value of an amplitude of a frequency component of the motor current in a specific frequency band during the acceleration/deceleration period (hereinafter, referred to as "the amplitude peak value of the motor current"), the motor current being one of a load current of one of the motors configured to drive the one operation part and a current value having a correlation with the load current, and a determining module configured to determine, based on the amplitude peak value of the motor current, whether a sign of failure exists in one of the reduction gears configured to reduce the speed of the rotational force of the one motor and transmit the reduced rotational force to the one operation part. The mechanical apparatus is provided with a plurality of natural frequencies, and one specific frequency band includes one of the natural frequencies at which the mechanical apparatus is oscillated by resonance in a meshing direction of a gear of the one reduction gear, and the determination is performed for each of the plurality of reduction gears.

According to this configuration, the determination of whether the sign of failure exists in the plurality of speed reduces is performed for every reduction gear, and the determination for each reduction gear is performed based on the amplitude peak value of the frequency component of the motor current in the specific frequency band during the acceleration/deceleration period of the operation of each operation part corresponding to the reduction gear. The principle of the determination is based on a phenomenon that when the rotational speed of the gear of the reduction gear (rotational frequency) becomes close to the natural frequency of the mechanical apparatus, the mechanical apparatus resonates with the excitation force caused by the meshing of the gear, and accordingly, the excitation force caused by the gear meshing increases due to the resonance, and as a result, the motor current of the motor which drives the gear concerned increases. In this case, it is necessary to identify a frequency component particular to the gear concerned among the frequency components of the motor current, and a frequency component of the motor current at a fundamental or a harmonic caused (originated) by the rotation of the gear concerned (hereinafter, may be referred to as a "gear frequency component"), is used as this particular frequency component. On the other hand, the mechanical apparatus is provided with the plurality of natural frequencies, and an oscillation mode (oscillation manner) of the mechanical apparatus differs depending on the natural frequencies. Thus, as the frequency of the frequency components to be extracted from the motor current in order to obtain the amplitude peak value of the gear frequency component of the motor current, the natural frequency which causes the oscillation mode where the mechanical apparatus oscillates in the meshing direction of the gear of the reduction gear for which existence of the sign of failure is to be determined, is used among the plurality of natural frequencies of the mechanical apparatus. Thus, it becomes easier to obtain the amplitude peak value of the gear frequency component in the motor current. That is, the detection sensitivity of the sign of failure improves.

In this configuration, one specific frequency band includes one of the plurality of natural frequencies of the mechanical apparatus, at which the mechanical apparatus is oscillated by resonance in the meshing direction of the gear of the one reduction gear. The one reduction gear is the reduction gear for which the existence of the sign of failure is to be determined, and the specific frequency band is the frequency of the frequency components extracted from the motor current in order to obtain the amplitude peak value of the motor current. Therefore, according to this configuration, it becomes easier to obtain the amplitude peak value of the gear frequency component in the motor current, and the detection sensitivity of the sign of failure is enhanced. As a result, whether the sign of failure exists can be diagnosed at an early stage.

The plurality of reduction gears may include an A reduction gear in which a gear meshes in an A-direction, and a B reduction gear in which a gear meshes in a B-direction different from the A-direction. The plurality of natural frequencies may include an A natural frequency at which the mechanical apparatus is oscillated by resonance in the meshing direction of the gear of the A reduction gear, and a B natural frequency at which the mechanical apparatus is oscillated by resonance in the meshing direction of the gear of the B reduction gear. The determining module may execute the determination by using an A specific frequency band including the A natural frequency for the A reduction gear, and using a B specific frequency band including the B natural frequency for the B reduction gear.

According to this configuration, for the two reduction gears of which the meshing directions of the respective gears are different from each other, the existence of the sign of failure can be determined using the specific frequency bands with which the detection sensitivity of the sign of failure of these reduction gears improves. As a result, whether the sign of failure exists in the two reduction gears with the different gear meshing directions, can be diagnosed at an early stage.

The determination may include a determination based on a comparison between the amplitude peak value of the motor current and a given amplitude threshold.

According to this configuration, whether the sign of failure exists can be diagnosed accurately.

The mechanical apparatus may be a vertical articulated robot, the plurality of operation parts may be a plurality of links and a plurality joints coupling the plurality of links of the robot, and the plurality of motors may be a plurality of motors configured to drive the plurality of joints, respectively, and the plurality of reduction gears are a plurality of reduction gears configured to reduce speeds of rotational forces of the plurality of motors and transmit the reduced rotational forces to the plurality of operation parts, respectively.

According to this configuration, the existence of the sign of failure in the reduction gears for the joints of the vertical articulated robot can be diagnosed at an early stage.

The motor current processing module may include an FFT processing module configured to generate, based on a rotational speed and the motor current of the one motor, three-dimensional frequency analysis data in which a group of time-series speed data correspond to frequency spectra of a group of motor current data, respectively, a gear frequency component acquiring module configured to extract a frequency component of the motor current of the gear of the one reduction gear at a fundamental or a harmonic, from the three-dimensional frequency analysis data, and acquire the extracted frequency component, a specific-frequency-band component acquiring module configured to extract a part existing in the specific frequency band, from the frequency component of the motor current of the gear at the fundamental or the harmonic, and acquire the extracted part, and an amplitude peak value extracting module configured to acquire the amplitude peak value of the motor current by extracting an amplitude peak value of the part of the frequency component of the motor current of the gear at the fundamental or the harmonic in the specific frequency band.

According to this configuration, the amplitude peak value of the motor current can be acquired appropriately by an FFT analysis.

The motor current processing module may include a resonance-time-window acquiring module configured to acquire a time window during which a rotational speed of the gear of the one reduction gear becomes a frequency in the specific frequency band during the acceleration/deceleration period, a specific-frequency-band component acquiring module configured to apply a band-pass filtering to the motor current of the one motor to acquire a frequency component of the motor current over a part or all of the specific frequency band, and an amplitude peak value acquiring module configured to acquire the amplitude peak value of the motor current based on the time window acquired by the time-window acquiring module, and the frequency component acquired by the frequency component acquiring module.

According to this configuration, the FFT analysis becomes unnecessary.

Moreover, according to another aspect of the present disclosure, a method of diagnosing failure is provided to diagnosis failure of a plurality of reduction gears provided to a mechanical apparatus including a plurality of operation parts, and a plurality of motors configured to drive the plurality of operation parts, respectively, the plurality of reduction gears being configured to reduce speeds of rotational forces of the plurality of motors and transmit the reduced rotational forces to the plurality of operation parts, respectively. The method includes the steps of identifying an acceleration/deceleration period of operation of one of the plurality of operation parts, processing motor current to acquire a peak value of an amplitude of a frequency component of the motor current in a specific frequency band during the acceleration/deceleration period (hereinafter, referred to as "the amplitude peak value of the motor current"), the motor current being one of a load current of one of the motors configured to drive the one operation part and a current value having a correlation with the load current, and determining, based on the amplitude peak value of the motor current, whether a sign of failure exists in one of the reduction gears configured to reduce the speed of the rotational force of the one motor and transmit the reduced rotational force to the one operation part. The mechanical apparatus is provided with a plurality of natural frequencies, and one specific frequency band includes one of the natural frequencies at which the mechanical apparatus is oscillated by resonance in a meshing direction of a gear of the one reduction gear, and the determining is performed for each of the plurality of reduction gears.

According to this configuration, the detection sensitivity of the sign of failure improves, and as a result, whether the sign of failure exists can be diagnosed at an early stage.

Moreover, a failure diagnosing device according to still another aspect of the present disclosure diagnoses failure of a reduction gear provided to a mechanical apparatus including an operation part, and a motor configured to drive the operation part, the reduction gear being configured to reduce a speed of rotational force of the motor and transmit the reduced rotational force to the operation part. The failure diagnosing device includes an acceleration/deceleration period identifying module configured to identify an acceleration/deceleration period of operation of the operation part, a motor current processing module configured to process motor current to acquire a peak value of an amplitude of a frequency component of the motor current in a specific frequency band during the acceleration/deceleration period (hereinafter, referred to as "the amplitude peak value of the motor current"), the motor current being one of a load current of the motor and a current value having a correlation with the load current, and a determining module configured to determine, based on the amplitude peak value of the motor current, whether a sign of failure exists in the reduction gear. The motor current processing module includes a resonance-time-window acquiring module configured to acquire a time window during which a rotational speed of the given gear constituting the reduction gear becomes a frequency in the specific frequency band during the acceleration/deceleration period, a specific-frequency-band component acquiring module configured to apply a band-pass filtering to the motor current to acquire a frequency component of the motor current over a part or all of the specific frequency band, and an amplitude peak value acquiring module configured to acquire the amplitude peak value of the motor current based on the time window acquired by the time-window acquiring module, and the frequency component acquired by the frequency component acquiring module.

According to this configuration, the amplitude peak value of the motor current can be acquired without performing the FFT analysis, and whether the sign of failure exists in the reduction gear can be diagnosed.

Effect of the Disclosure

The present disclosure achieves the effect that a device and a method for diagnosing failure of reduction gears, capable of determining at an early stage existence of a sign of failure can be provided.

BRIEF DESCRIPTION OF DRAWINGS

FIG. 7 is a table illustrating a correspondence relation between a specific-frequency-band and the joint suitable for the failure diagnosis of the 6-axis vertical articulated robot illustrated in FIG. 4.

FIG. 8 is a graph illustrating one example of a change in a rotational speed of a given gear of the reduction gear during an acceleration/deceleration period of an operation part illustrated in FIG. 1.

FIG. 9 is a graph schematically (conceptually) illustrating one example of a relation between changes in frequencies of a fundamental and a harmonic of motor current originated by the given gear, accompanying with the change in the rotational speed of the given gear illustrated in FIG. 8, and the specific frequency band.

MODES FOR CARRYING OUT THE DISCLOSURE

Figure 1:
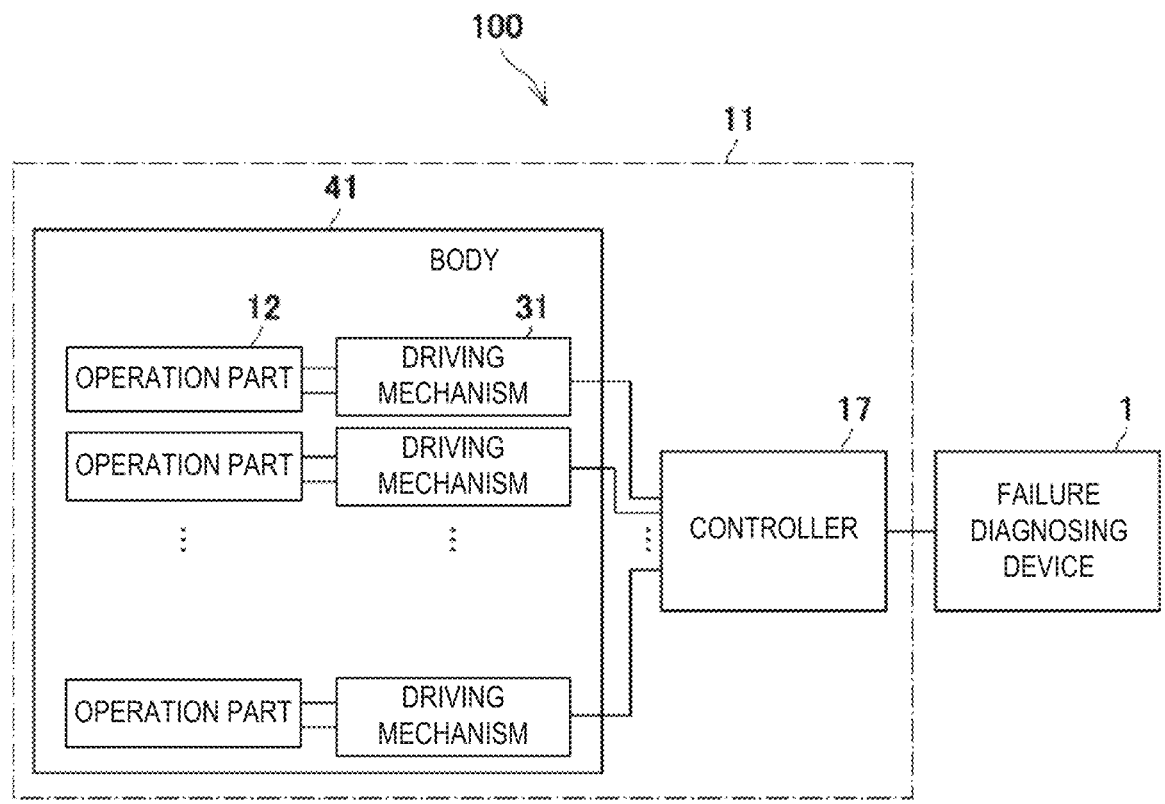
FIG. 1 is a functional block diagram illustrating a configuration of a failure diagnosis system of a mechanical apparatus, for which a device of diagnosing failure of reduction gears according to Embodiment 1 of the present disclosure is used.

Hereinafter, embodiments of the present disclosure are described with reference to the drawings. Note that, throughout the drawings, the same reference characters are assigned to the same or corresponding elements to omit redundant description. Further, the present disclosure is not limited by the following embodiments.

Embodiment 1

Configuration

Outline of Failure Diagnosis System

Figure 2:
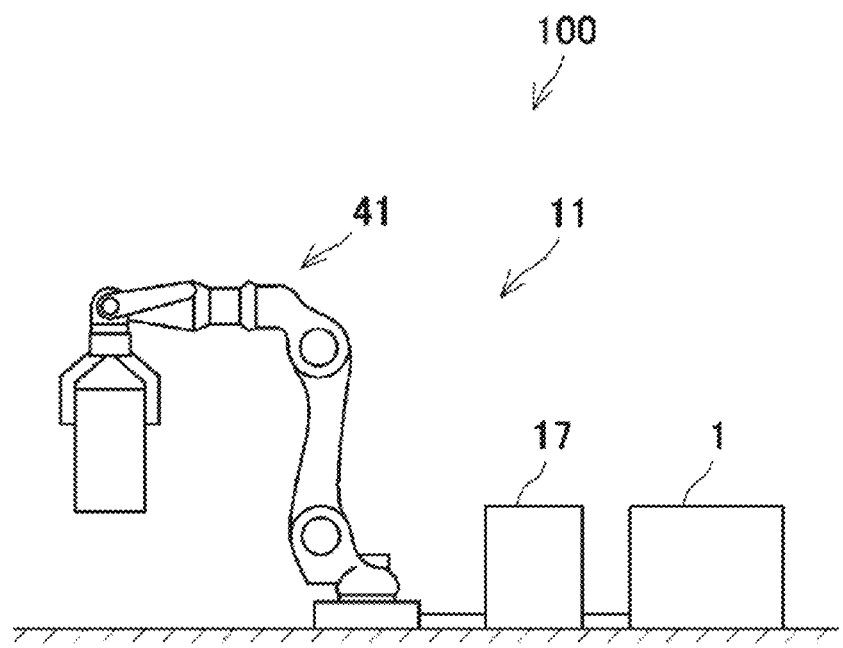
FIG. 2 is an external view illustrating the configuration of the failure diagnosis system of the mechanical apparatus illustrated in FIG. 1.

FIG. 1 is a functional block diagram illustrating a configuration of a failure diagnosis system of a mechanical apparatus, for which a device of diagnosing failure of reduction gears according to Embodiment 1 of the present disclosure is used. FIG. 2 is an external view illustrating the configuration of the failure diagnosis system of the mechanical apparatus illustrated in FIG. 1. In FIG. 2, a vertical articulated robot (hereinafter, may simply be referred to as a "robot") is illustrated as one example of a mechanical apparatus 11.

Referring to FIGS. 1 and 2, a failure diagnosis system 100 of Embodiment 1 includes a failure diagnosing device 1 and the mechanical apparatus 11. The mechanical apparatus 11 includes a body 41 and a controller 17. The controller 17 is connected to the body 41 through a communication cable used for transmitting various signals etc. Further, the failure diagnosing device 1 is connected to the controller 17 through a communication cable used for transmitting various data.

The body 41 of the mechanical apparatus 11 includes a plurality of operation parts 12 for implementing a function of the mechanical apparatus 11, and a plurality of driving mechanisms 31 for driving the plurality of operation parts 12, respectively.

The mechanical apparatus 11 is not particularly limited, as long as it includes the operation part 12 and the driving mechanism 31.

The body 41 of the mechanical apparatus 11 is a mechanical structure part of the mechanical apparatus 11, and has a plurality of natural frequencies. The operation parts 12 and the driving mechanisms 31 are mechanically coupled to the mechanical structure of the body 41, and oscillate together with the body 41 when excitation force is applied to the body 41.

The controller 17 controls operations of the operation parts 12 of the body 41.

The failure diagnosing device 1 diagnoses whether the driving mechanism 31 of the mechanical apparatus 11 indicates a sign of failure.

Below, the above components will be described in detail.

Mechanical Apparatus 11

Figure 3:
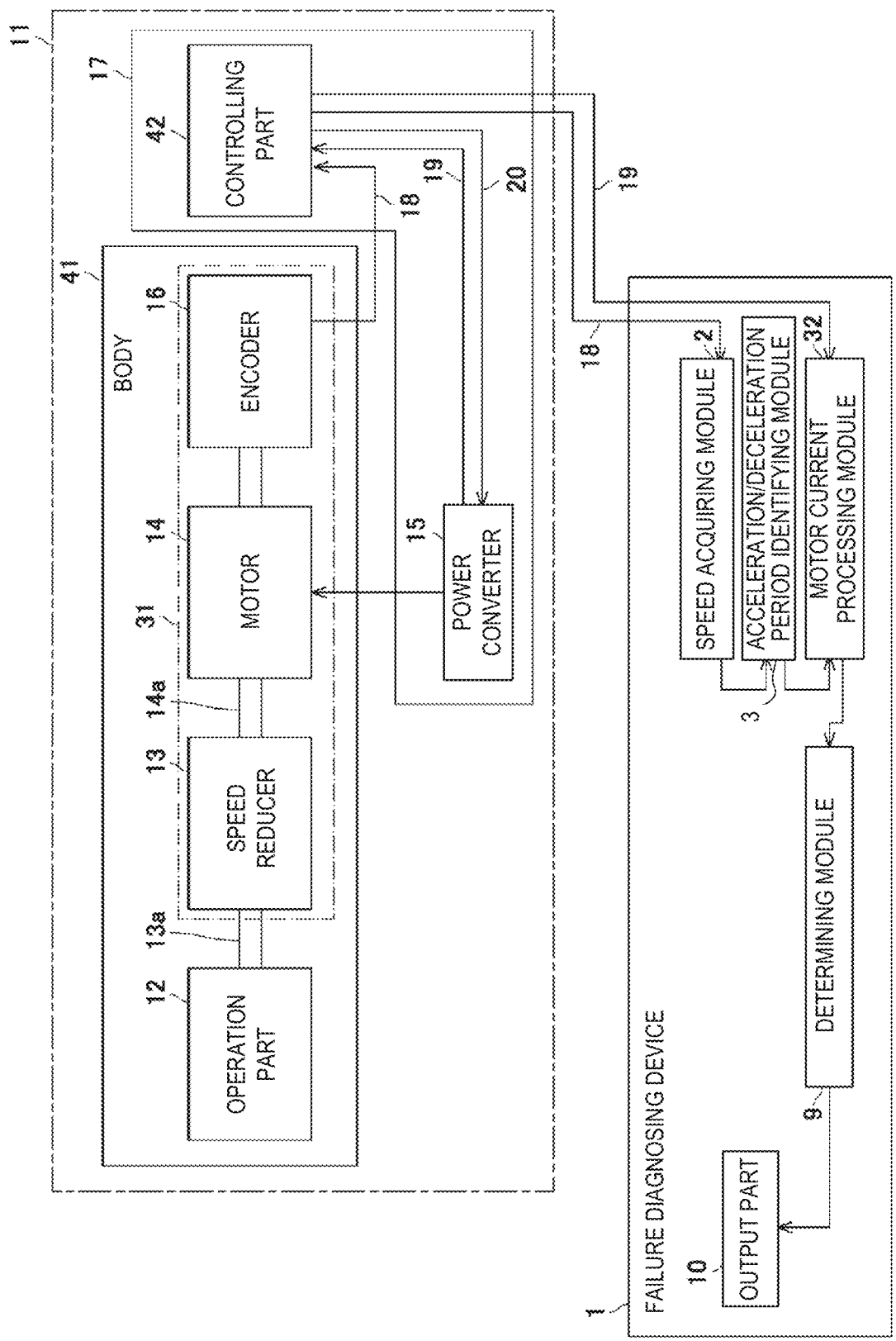
FIG. 3 is a functional block diagram illustrating a configuration of the mechanical apparatus and the failure diagnosing device illustrated in FIG. 1.

FIG. 3 is a functional block diagram illustrating a configuration of the mechanical apparatus 11 and the failure diagnosing device 1 illustrated in FIG. 1. In FIG. 3, one of the plurality of operation parts 12 and one of the plurality of driving mechanisms 31 of the body 41 of the mechanical apparatus 11 are illustrated. The following description is similarly applicable to the other operation parts 12 and the other driving mechanisms 31.

First, the driving mechanism 31 provided with a motor 14 and a reduction gear 13 which is a diagnosis target of the failure diagnosing device 1, and the mechanical apparatus 11 provided with the driving mechanism 31, are described.

The mechanical apparatus 11 includes the body 41 and the controller 17. The controller 17 includes a power converter 15 which supplies controlled power (here, current) to the motor 14 of the body 41, and a controlling part 42 which controls operation of the body 41 by using the power converter 15.

The body 41 includes the operation part 12, the motor 14 which drives the operation part 12, the reduction gear 13 which reduces a speed of rotational force of the motor 14 and transmits it to the operation part 12, and an encoder 16 which detects a rotational position of the motor 14. The driving mechanism 31 is comprised of the motor 14 as a driving source, and a power transmission path extending from the motor 14 to the operation part 12. The reduction gear 13 constitutes a part of the power transmission path.

Referring to FIG. 2, a typical example of the mechanical apparatus 11 is a robot. An operation part of a robot body of the robot constitutes the operation part 12 of the body 41. For example, in a case of an articulated robot, a pedestal (base part) fixed to a fixing target constitutes a stationary part, one or more joints and links which are coupled to the pedestal, and an end effector constitute the operation parts 12. The mechanical apparatus 11 includes a construction machinery and a machine tool, other than those described above. Note that the robot will be described later in detail.

The reduction gear 13 may be any device, as long as the speed of the rotational force of the motor 14 is reduced and transmitted to the operation part 12. For example, the reduction gear 13 reduces the speed of rotational force of an input shaft by a deceleration mechanism (not illustrated), and outputs the reduced rotational force to an output shaft 13a. Although in FIG. 3 a rotary axis 14a of the motor 14 is illustrated as the input shaft, the input shaft may be, for example, an output shaft of another operation part. Moreover, a reduction gear mechanism is typically illustrated as the deceleration mechanism.

The motor 14 is a servomotor, and may be a brushless motor or a direct current motor. Alternatively, the motor 14 may be other motors, such as an induction motor. When the servomotor is used, the encoder 16 is used together to control the position of the operation part 12. An installation position of the motor 14 may be at the stationary part of the mechanical apparatus 11 or the operation part 12. In the case of the robot, the motor 14 is provided for driving a distal-side link of each joint except for a first joint. Therefore, for the joints except for the first joint, the motors 14 are provided at the respective operation parts. For the first joint, the motor 14 is provided to the stationary part.

The encoder 16 is provided to the rotary axis 14a of the motor 14. The encoder 16 may be any device, as long as it detects a rotational angle (rotational position) of the motor 14. Note that, when the motor 14 is comprised of the induction motor etc., and the positional control of the operation part 12 is not performed, for example, a speed detector may be used instead of the encoder 16.

The power converter 15 supplies to the motor 14 power of which voltage or current is controlled (current is controlled in FIG. 3), so as to drive the motor 14. Since the power converter 15 is well known, detailed description thereof is omitted. In FIG. 3, the power converter 15 is provided with a current sensor (not illustrated), detects the current supplied to the motor 14 (load current of the motor 14), and outputs the detected current 19 to the controlling part 42. The current sensor may be provided outside the power converter 15.

The controlling part 42 generates a current command value 20 based on the rotational angle 18 of the motor 14 inputted from the encoder 16, and the motor current 19 inputted from the current sensor of the power converter 15, and outputs the generated current command value 20 to the power converter 15. The power converter 15 outputs to the motor 14 power at a current according to the current command value 20. In this manner, the controlling part 42 performs feedback control of the rotational angle and torque of the motor 14.

Moreover, the controlling part 42 stores the rotational 18 angle of the motor 14 inputted from the encoder 16, the motor current 19 inputted from the current sensor, and the current command value 20, as time-series data sampled at given time intervals. The time-series data is read by the failure diagnosing device 1 so as to be used for the failure diagnosis as will be described later. The controlling part 42 stores the time-series data for each of a plurality of given driving mechanisms 31 for which the failure diagnosis is performed, among the plurality of driving mechanisms 31 of the mechanical apparatus 11.

The controlling part 42 is comprised of an arithmetic unit, which is, for example, a personal computer or a microcontroller. The controlling part 42 (arithmetic unit) has a processing module and a memory, and the processing module reads a given control program stored in the memory, and executes it to perform given operation control. The controlling part 42 is a functional part implemented by the given control program being executed, and actually, the arithmetic unit operates as the controlling part 42.

Failure Diagnosing Device 1

Next, the failure diagnosing device 1 is described. The failure diagnosing device 1 acquires the time-series data of the rotational angle of the motor 14, and the time-series data of a "motor current" which is the load current of the motor 14 or a current value having a correlation with the load current, which are required for the failure diagnosis, by reading them from the controlling part 42 of the controller 17. Therefore, failure can be diagnosed at a desired timing separately from the operation of the mechanical apparatus 11. Note that each of the rotational angle of the motor 14 detected by the encoder 16, and the "motor current" (the motor current 19 detected by the current sensor or the current command value 20 outputted from the controlling part) may directly be inputted into the failure diagnosing device 1. Accordingly, the failure diagnosis can be performed in real time.

The failure diagnosing device 1 is provided with an acceleration/deceleration period identifying module 3, a motor current processing module 32, and a determining module 9. The acceleration/deceleration period identifying module 3 identifies an acceleration/deceleration period in operation of one of the plurality of operation parts 12. The motor current processing module 32 processes the motor current to acquire an amplitude peak value of frequency components in a specific frequency band of the motor current (the load current 19 or the current value 20 having a correlation with the load current 19) of one motor 14 which drives the operation part 12 during the acceleration/deceleration period (hereinafter, referred to as the "amplitude peak value of the motor current"). The determining module 9 determines, based on the amplitude peak value of the motor current, whether the sign of failure exists in one reduction gear 13 which transmits the rotational force of the one motor 14 to the one operation part 12 while reducing the rotational force.

Further, one specific frequency band includes one of the plurality of natural frequencies, at which the mechanical apparatus 11 is oscillated by resonance in a meshing direction of the gear of the reduction gear 13. The failure diagnosing device 1 performs the determination described above for each of the plurality of reduction gears 13.

Below, this configuration is described in detail.

The failure diagnosing device 1 is comprised of an arithmetic unit. The arithmetic unit is, for example, a computer, a personal computer, or a microcontroller which operates according to a program, or a hardware including a logic circuit, an electronic circuit, etc. Here, the failure diagnosing device 1 is comprised of an arithmetic unit which operates according to a program. This arithmetic unit is provided with a processor and a memory, and executes a given failure diagnosis by the processor reading and executing a given failure-diagnosis program stored in the memory. The failure diagnosing device 1 includes a speed acquiring module 2, the acceleration/deceleration period identifying module 3, the motor current processing module 32, the determining module 9, and an output part 10. The processor is, for example, a CPU, an MPU, an FPGA (Field Programmable Gate Array), or a PLC (Programmable Logic Controller). The memory is, for example, an internal memory, such as a ROM, and/or an external memory, such as a hard disk.

The functional parts 2, 3, 32, and 9 are functional parts implemented by the given failure diagnosis program being executed, and actually, the arithmetic unit operates as the functional parts 2, 3, 32, and 9.

The speed acquiring module 2 reads the time-series data of the rotational angle 18 of the motor 14 from the controlling part 42 of the controller 17, and based on this, acquires (and temporarily stores) a rotational speed of the motor 14. Note that, when the speed detector is provided instead of the encoder 16, the rotational speed of the motor 14 is acquired based on the rotational speed detected by the speed detector.

The acceleration/deceleration period identifying module 3 identifies the acceleration/deceleration period of the operation part 12 of the mechanical apparatus 11 based on the rotational speed of the motor 14 acquired by the speed acquiring module 2.

Figure 10:
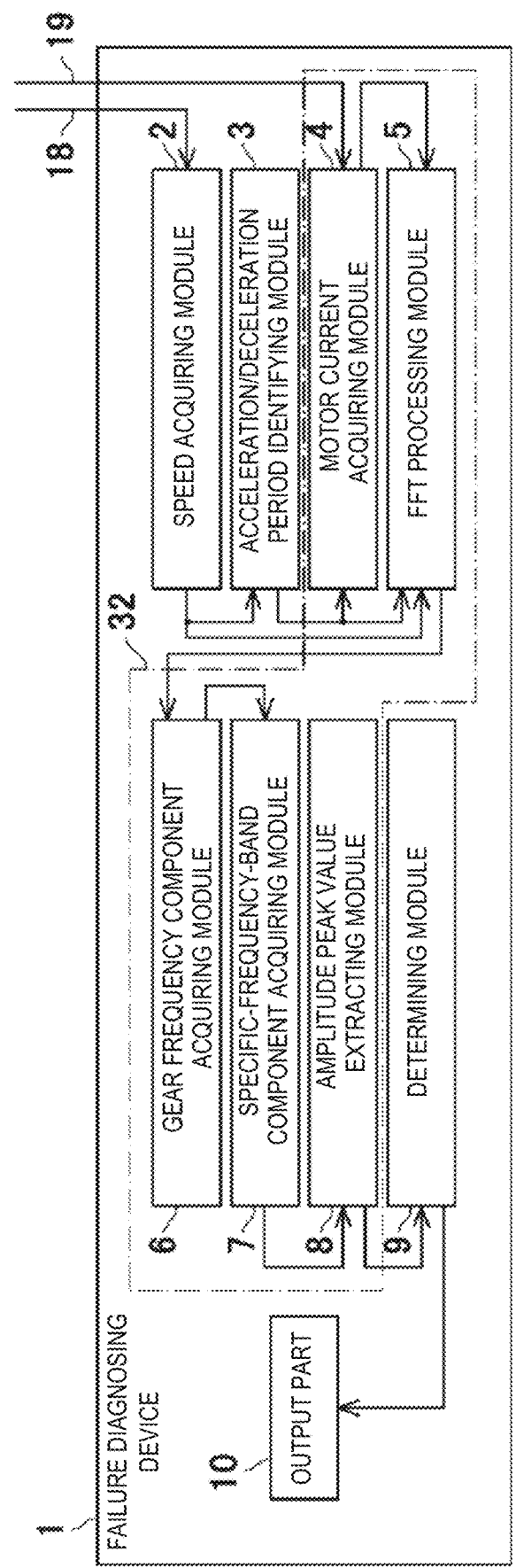
FIG. 10 is a functional block diagram illustrating one example of a configuration of a motor current processing module of the failure diagnosing device illustrated in FIG. 3.

A motor current acquiring module 4 (FIG. 10) reads the time-series data of the "motor current" from the controlling part 42 of the controller 17, and acquires it. Here, the current 19 detected by the current sensor is acquired (and temporarily stored) as the "motor current." Note that the current command value 20 outputted from the controlling part 42 may be acquired as the "motor current." The current command value is a command signal according to a deviation of the present value from the load current of the motor 14, from which a result comparable to the load current of the motor can be obtained. Concrete processing of the motor current and the "specific frequency band" will be described later in detail.

The motor current processing module 32 acquires the peak value of the amplitude of the frequency components in the specific frequency band of the "motor current" (the load current 19 or the current value 20 having a correlation with the load current 19) of the motor 14 during the acceleration/deceleration period.

Based on the amplitude peak value, the determining module 9 determines whether there is a sign of failure in the plurality of reduction gears 13 of the mechanical apparatus 11. In detail, the determining module 9 compares the amplitude peak value of the motor current with a given amplitude threshold, and based on the result, the existence of the sign of failure in the reduction gear 13 is determined. For example, when the amplitude peak value of the motor current is above the given amplitude threshold, the determining module 9 determines that the reduction gear 13 indicates the sign of failure, and when the amplitude peak value of the motor current is below the given amplitude threshold, the determining module 9 determines that the reduction gear 13 does not indicate the sign of failure. This amplitude threshold is determined by conducting experiment, simulation, etc. The amplitude threshold is determined corresponding to an acceptable limit threshold which is indicative of an acceptable limit of a physical quantity (parameter) relative to deterioration (sign of failure) of the reduction gear 13. For example, in Embodiment 1, the amplitude threshold is determined corresponding to an acceptable limit threshold of an iron powder concentration of grease of the reduction gear 13.

The output part 10 outputs the determination result of the determining module 9. The output part 10 is comprised of, for example, a display unit or an alarm which displays the determination result, a transmitter which externally transmits the determination result, and a printer which prints the determination result.

Principle of Determination of Sign of Failure

Figure 4:
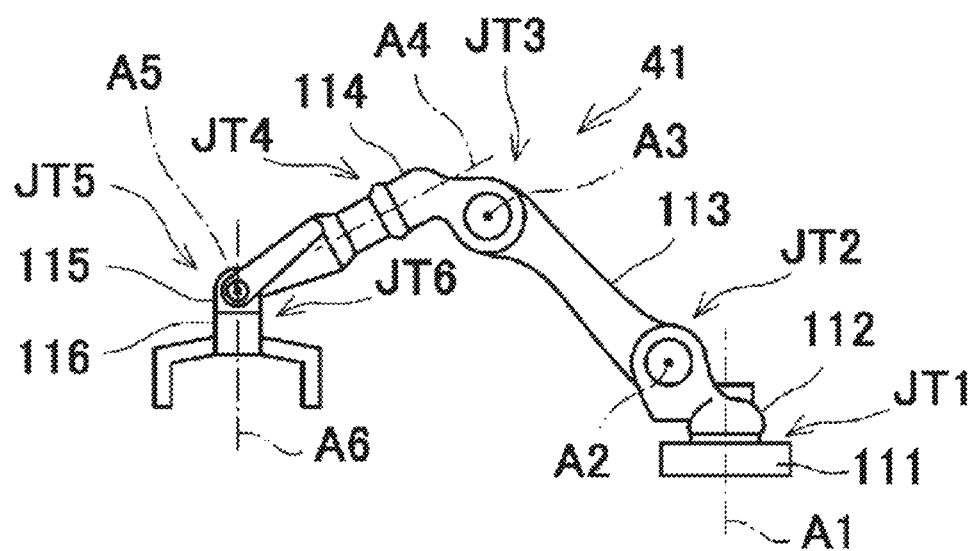
FIG. 4 is an external view illustrating a configuration of a 6-axis vertical articulated robot which is one example of the mechanical apparatus illustrated in FIG. 1.

FIG. 4 is an external view illustrating a configuration of a 6-axis vertical articulated robot which is one example of the mechanical apparatus 11 illustrated in FIG. 1.

Natural Frequency of Mechanical Apparatus 11

Referring to FIG. 4, a robot body (41) of the vertical articulated robot as one example of the body 41 of the mechanical apparatus 11 includes a pedestal 111, a swiveling body 112, a lower arm 113, an upper arm 114, a wrist part 115, and an end effector 116. The swiveling body 112 is provided to the pedestal 11 via a first joint JT1 so as to be swivelable about a first vertical rotation axis A1. The lower arm 113 is provided to the swiveling body 112 via a second joint JT2 so as to be pivotable about a second horizontal rotation axis A2. The upper arm 114 is provided to the lower arm 113 via a third joint JT3 so as to be pivotable about a third rotation axis A3 which is parallel with the second rotation axis A2. The wrist part 115 is provided to the upper arm 114 via a fifth joint JT5 so as to be pivotable about a fifth rotation axis A5 which is parallel with the second rotation axis A2. The end effector 116 is attached to the wrist part 115 via a sixth joint JT6 so as to be rotatable about a sixth rotation axis A6 which is perpendicular to the fifth rotation axis A5. Moreover, the upper arm 114 is provided with a fourth joint JT4 which allows rotation of the wrist part 115 about a fourth rotation axis A4 which is perpendicular to the fifth rotation axis A5 and extends in a longitudinal direction of the upper arm 114.

As described above, this robot body (41) has a plurality of natural frequencies. Further, the robot body (41) takes various postures.

Here, the present inventors found out though experiment that the plurality of natural frequencies slightly vary depending on the posture of the robot body (41). The experiment is conducted as follows. A 3-axis accelerometer (not illustrated) is attached to the second joint of the robot body (41) of the vertical articulated robot illustrated in FIG. 4, and the posture of the robot body (41) is changed to seven different postures. The robot body (41) is applied with the weight of 200 kg (the end effector is caused to hold an object of 200 kg). Then, the robot body (41) is applied with impact in each posture, and a caused oscillation is measured by the 3-axis accelerometer, and the measurement data is frequency analyzed.

As will be described later, the determination of existence of the sign of failure in the reduction gear 13 utilizes a phenomenon that the robot body (41) (the body 41 of the mechanical apparatus 11) and thus the reduction gear 13 resonate with the excitation force of the reduction gear 13 at the plurality of natural frequencies, and accordingly, the motor current of the motor 14 which is the driving source of the reduction gear 13 increases.

Therefore, in the present disclosure, in consideration of the variation in the natural frequency according to the posture of the robot body (41), the "specific frequency band" which is a frequency band considering a variation width of the natural frequency, is defined as a resonant frequency band used for the determination. The specific frequency band is assigned with a reference character "fr," and is referred to as an "n-th specific frequency band" in an ascending order of a center frequency, while a suffix "n" is given to the reference character ("n" is a natural number).

Referring to FIG. 9, for example, a first specific frequency band fr1 is defined by a center frequency fc1, a lower-limit frequency fl1, and an upper-limit frequency fu1. An arbitrary n-th specific frequency band frn is defined by a center frequency fcn, a lower-limit frequency fln, and an upper-limit frequency fun. The center frequency fcn is the natural frequency in a given reference posture of the robot body (41). The lower-limit frequency fln and the upper-limit frequency fun are determined through experiment, simulation, calculations, etc.

Oscillation Mode

The present inventors found out through experiment that an interesting oscillation mode is caused by resonance at a lower natural frequency of the robot body (41). The experiment is conducted as follows.

Figure 5:
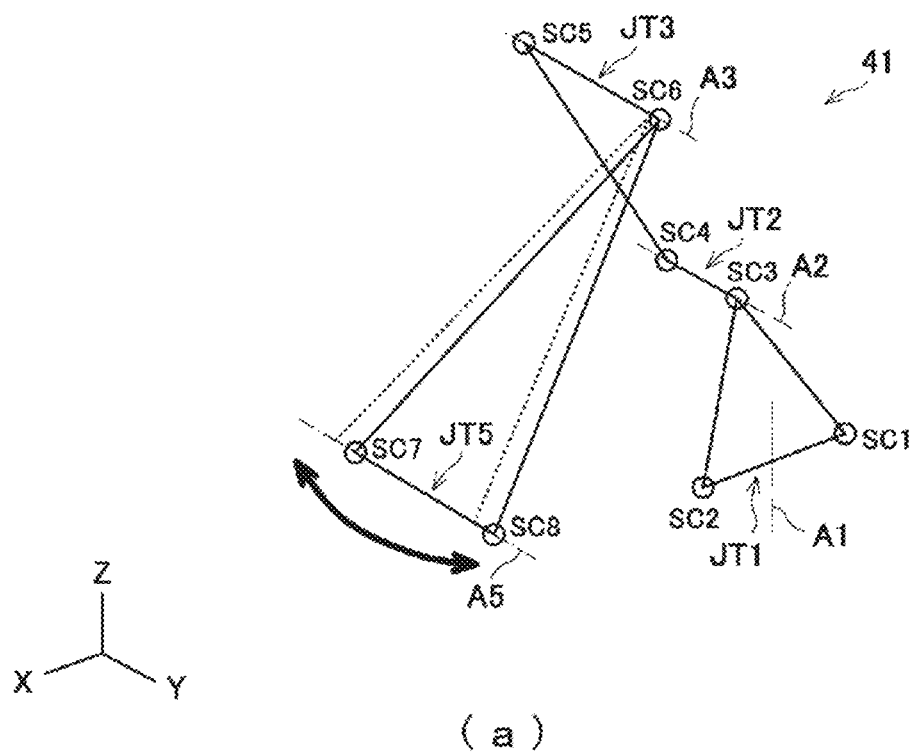
FIGS. 5(a) and 5(b) are schematic views illustrating oscillation modes caused by resonance of the 6-axis vertical articulated robot illustrated in FIG. 4.
Figure 5:
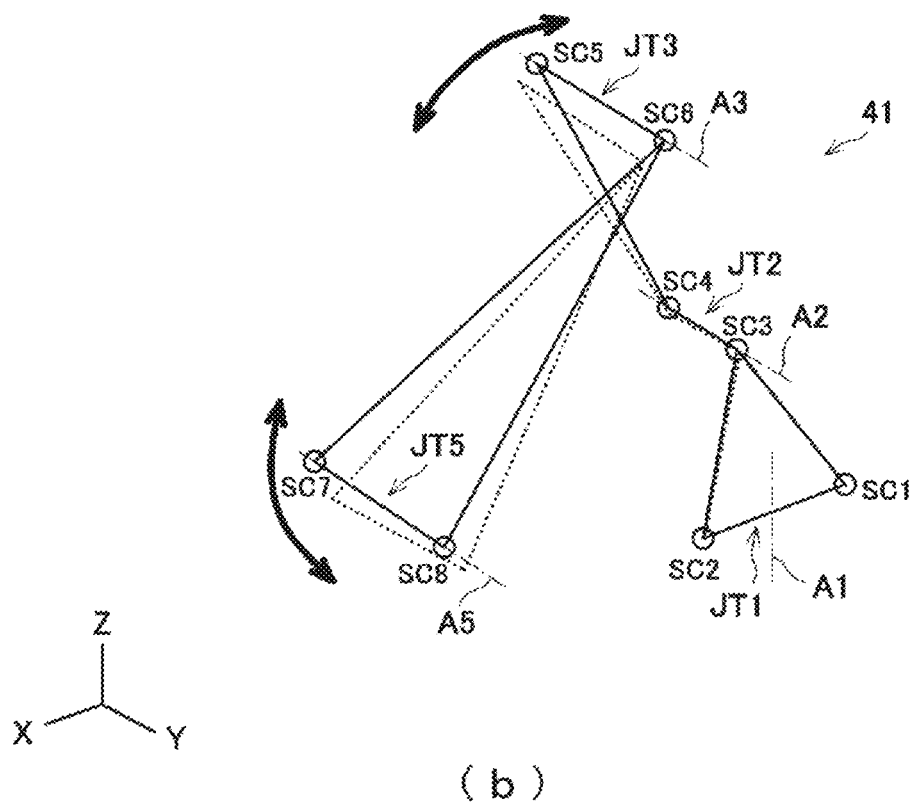

FIGS. 5(a) and 5(b) are schematic views illustrating oscillation modes caused by resonance of the 6-axis vertical articulated robot illustrated in FIG. 4. FIG. 5(a) illustrates an oscillation mode at a lowest natural frequency, and FIG. 5(b) illustrates an oscillation mode at a second lowest natural frequency.

Referring to FIGS. 5(a) and 5(b), in this experiment, a pair of 3-axis accelerometer SC1 and SC2 are attached to a pair of parts of the swiveling body 112 so as to sandwich the first rotation axis A1 of the first joint JT1 therebetween. A pair of 3-axis accelerometer SC3 and SC4 are attached to the second joint JT2 at a pair of positions on the second rotation axis A2. A pair of 3-axis accelerometer SC5 and SC6 are attached to the third joint JT3 at a pair of positions on the third rotation axis A3. A pair of 3-axis accelerometer SC7 and SC8 are attached to the fifth joint JT5 at a pair of positions on the fifth rotation axis A5. Then, the robot body (41) is applied with impact, and a caused oscillation is measured by the 3-axis accelerometers SC1-SC8, and the measurement data is frequency analyzed. The result is as follows.

FIGS. 5(a) and 5(b) illustrate the overview of the robot body (41), by connecting the 3-axis accelerometers SC1-SC8 with straight lines in order. In FIGS. 5(a) and 5(b), solid lines and broken lines indicate oscillation ranges of the robot body (41), and arrows indicate the direction of the oscillation. Further, in FIGS. 5(a) and 5(b), X, Y, and Z indicate a coordinate system of the robot body (41). FIGS. 5(a) and 5(b) illustrate the overview the robot body (41) when seen from obliquely upward at a middle angle between the X-direction and the Y-direction.

As illustrated in FIG. 5(a), at the lowest natural frequency, a lateral oscillation (oscillation in a substantially horizontal plane) is caused to the robot body (41) by resonance. Moreover, as illustrated in FIG. 5(b), at the second lowest natural frequency, a vertical oscillation (oscillation in a substantially vertical plane) is caused to the robot body (41) by resonance.

Figure 6:
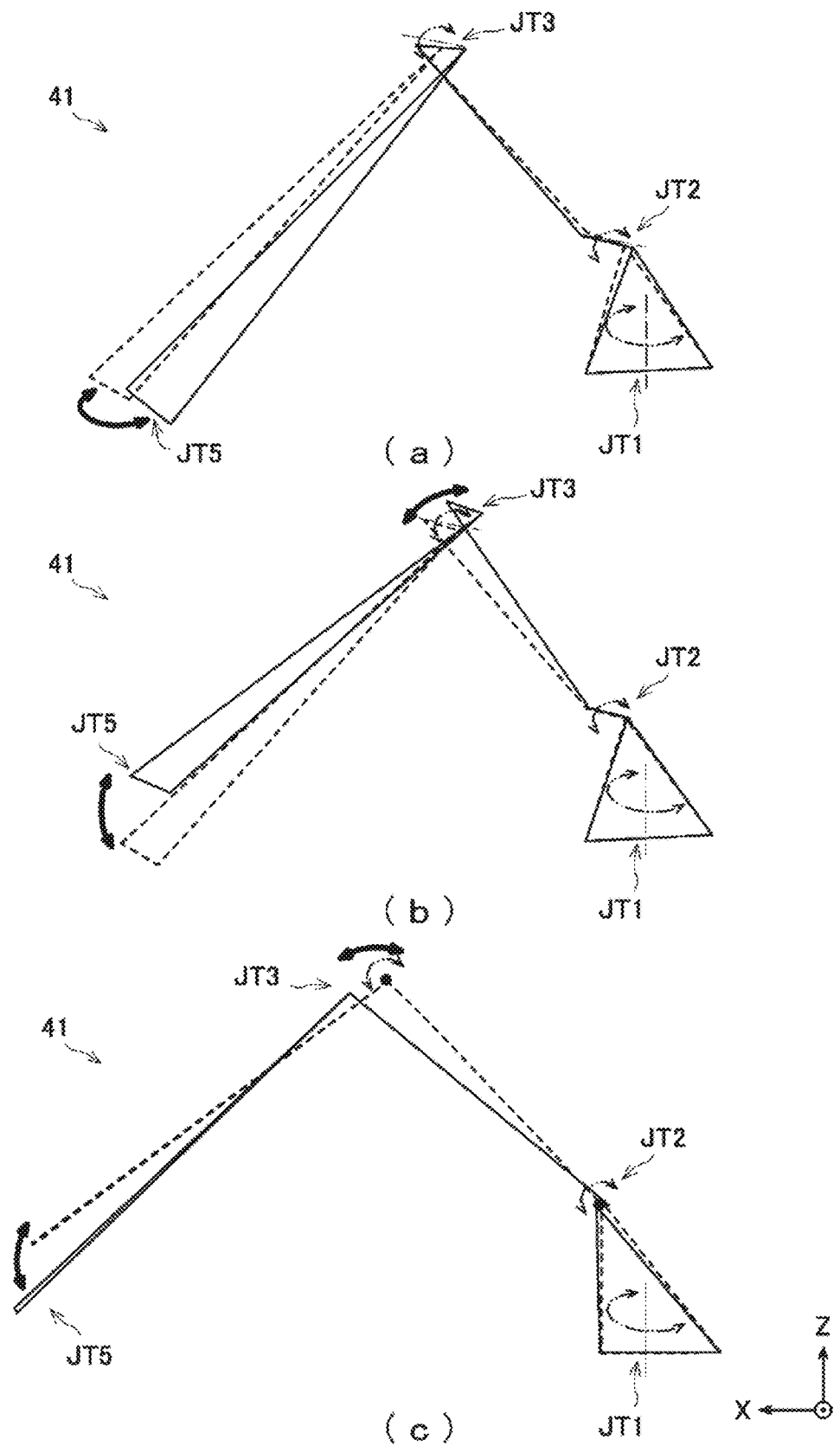
FIGS. 6(a) to 6(c) are schematic views each illustrating a relation between the oscillation mode caused by the resonance of the 6-axis vertical articulated robot in FIG. 4, and a meshing direction of a gear of the reduction gear which drives a joint.

FIGS. 6(a) to 6(c) are schematic views each illustrating a relation between the oscillation mode caused by the resonance of the 6-axis vertical articulated robot in FIG. 4, and the meshing direction of the gear of the reduction gear 13 which drives the joint.

Although the perspective in FIGS. 6(a) and 6(b) is the same as that in FIGS. 5(a) and 5(b), FIG. 6(c) illustrates the overview of the robot body (41) when seen from the Y-direction.

In FIGS. 6(a) to 6(c), bold solid arrows indicate the oscillation of the robot body (41), and thin two-dot chain lines indicate the meshing direction of the gear of the reduction gear 13 which drives each of the joints JT1-JT3.

As illustrated in FIG. 6(a), the lateral oscillation caused by the resonance at the lowest natural frequency is in a meshing direction of the gear of the reduction gear 13 which drives the first joint JT1. As illustrated in FIGS. 6(a) and 6(b), the vertical oscillation caused by the resonance at the second lowest natural frequency is in a meshing direction of the gear of the reduction gear 13 which drives each of the second joint JT2 and the third joint JT3.

FIG. 7 is a table illustrating a correspondence relation between the specific frequency band and the joint suitable for the failure diagnosis of the 6-axis vertical articulated robot illustrated in FIG. 4. Referring to FIG. 7, the first specific frequency band fr1 including the lowest natural frequency causes the lateral oscillation to the robot body (41) by resonance. A second specific frequency band fr2 including the second lowest natural frequency causes the vertical oscillation to the robot body (41) by resonance.

Based on the experiment result, it is estimated that, also in the mechanical apparatus 11 other than the robot, different oscillations are caused to the mechanical apparatus 11 by resonance in a plurality of specific frequency bands.

Resonance Caused by Operation of Operation Part 12

FIG. 8 is a graph illustrating one example of a change in the rotational speed of a given gear of the reduction gear 13 during the acceleration/deceleration period of the operation part 12 illustrated in FIG. 1.

Referring to FIG. 3, the failure diagnosis of the reduction gear 13 is performed by focusing on a given one gear of the reduction gear 13. Although a criterion for the selection of the given gear is arbitrary, in this embodiment, a gear which most easily wears out (i.e., a gear which governs the life of the reduction gear 13) is selected.

Referring to FIG. 8, during the acceleration/deceleration period of the operation part 12, the given gear shows, for example, the change in the rotational speed to increase from zero and reach the maximum value, and then decrease to zero as illustrated in FIG. 8. The rotational speed of the given gear is calculated by multiplying a reduction ratio of the gear to a rotational speed of the motor 14.

FIG. 9 is a graph schematically (conceptually) illustrating one example of a relation between a change in a harmonic frequency of the motor current originated by the given gear, accompanying with the change in the rotational speed of the given gear illustrated in FIG. 8, and the specific frequency bands. In FIG. 9, Ip and Is indicate a fundamental component and a second harmonic component of the motor current originated by the given gear, respectively. Moreover, circles indicate the peak values of the amplitude of the frequency components in the specific frequency bands of the motor current, and the size of the circles indicate the magnitude of the peak values.

The excitation force of the given gear includes a frequency component which is a natural-number multiple of a frequency into which the rotational speed of the given gear is converted (hereinafter, may be referred to as a "gear frequency component"). Since the motor current changes according to the excitation force of the given gear, the motor current also includes a similar gear frequency component.

Referring to FIG. 9, accompanying with the change in the rotational speed of the given gear, when the frequencies of a first frequency component (fundamental component) Ip and a second frequency component (second harmonic component) Is of the gear frequency components of the motor current (accurately, the load current 19 of the motor 14) become the frequencies in the first and second specific frequency bands fr1 and frn, the robot body (41) including the reduction gear 13 resonates with the excitation force of the given gear which is driven by the motor current. Accordingly, the peak values of the amplitude of the first frequency component Ip and the second frequency component Is of the gear frequency components of the motor current increase. In this case, the amplitude peak value of the first frequency component Ip is larger than the amplitude peak value of the second frequency component Is. Therefore, in Embodiment 1, the amplitude peak value of the first frequency component (fundamental component) Ip is used for determining the existence of the sign of failure.

Selection of Specific Frequency Band

Referring to FIG. 3, when the gear of the reduction gear 13 is worn out, the excitation force due to the gear meshing becomes larger, and thus, the current 19 of the motor 14 which drives the reduction gear 13 increases. When the excitation force caused by the gear meshing of the reduction gear 13 resonates with the robot body (41), the current 19 of the motor 14 which drives the reduction gear 13 becomes further larger. Moreover, when the robot body (41) resonates in a direction similar to the meshing direction of the gear of the reduction gear 13, the excitation force due to the gear meshing of the reduction gear 13 further increases, thus the current 19 of the motor 14 which drives the reduction gear 13 becoming further larger. In this case, it is necessary to identify a frequency component particular to the gear concerned among the frequency components of the current of the motor 14, and the gear frequency component caused (originated) by the rotation of the gear concerned is used as this particular frequency component.

Therefore, as the frequency band within which the frequency components are extracted from the motor current in order to obtain the amplitude peak value of the gear frequency component of the motor current, the specific frequency band fr which causes the oscillation mode where the robot body (41) (the body 41 of the mechanical apparatus 11) oscillates in the meshing direction of the gear of the reduction gear 13 for which existence of the sign of failure is to be determined, is used among the plurality of frequency bands fr corresponding to the plurality of natural frequencies of the robot body (41). Thus, it becomes easier to obtain the amplitude peak value of the gear frequency component of the gear in the motor current. That is, detection sensitivity of the failure sing is enhanced.

Therefore, in the robot body (41) incorporating the plurality of reduction gears 13, by selecting the specific frequency band fr which causes the oscillation of the robot body (41) and facilitates the acquisition of the amplitude peak value of the gear frequency component of the given gear of each reduction gear 13 according to the meshing direction of the given gear of the reduction gear 13, the detection sensitivity of the sign of failure improves. As a result, existence of the sign of failure in the plurality of reduction gears 13 can be diagnosed at an early stage.

Selecting Example of Specific Frequency Band fr

Referring to FIG. 4, the rotation axis A1 of the first joint JT1 of the robot body (41) is vertical, and the rotation axis A2 of the second joint JT2 and the rotation axis A3 of the third joint JT3 are horizontal.

A direction of a rotation axis of the gear of the reduction gear 13 which drives a certain joint (JT1-JT6) depends on design. Here, a case is described as an example, in which the rotation axis of the given gear is parallel to the rotation axis (A1-A6) of the joint (JT1-JT6). In this case, a rotating direction centering on the rotation axis (A1-A6) of the joint (JT1-JT6) is the meshing direction of the given gear.

Referring to FIG. 7, as described above, the oscillation of the robot body (41) caused by the resonance in the first specific frequency band fr1 is lateral oscillation, and the oscillation of the robot body (41) caused by the resonance in the second specific frequency band fr2 is vertical oscillation. Therefore, the first specific frequency band fr1 is used for the failure diagnosis of the reduction gear 13 of the first joint JT1, and the second specific frequency band fr2 is used for the failure diagnosis of the reduction gears 13 of the second joint JT2 and the third joint JT3.

Configuration of Motor Current Processing Module 32

In this embodiment, the motor current processing module processes the motor current by using an FFT (Fast Fourier Transform) analysis.

In detail, the motor current processing module 32 includes an FFT processing module 5, a gear frequency component acquiring module 6, a specific-frequency-band component acquiring module 7, and an amplitude peak value extracting module 8.

The FFT processing module 5 generates a group of time-series speed data by sequentially sampling the rotational speed of the motor acquired by the speed acquiring module 2 during the acceleration/deceleration period. Moreover, the FFT processing module 5 generates a group of time-series current data by sequentially sampling the motor current acquired by the motor current acquiring module 4 during the acceleration/deceleration period.

Here, segmenting (extracting) and the sampling of the rotational speed data and the motor current data are described. The speed acquiring module 2 and the motor current acquiring module 4 acquire the motor rotational speed and the motor current as the time-series data, respectively. As for the time-series data, although it is necessary to perform the segmenting of a part of the acceleration/deceleration period and the sampling, either one may be performed first. Moreover, for the sampling, the sampling frequency according to the rotational speed of the motor is determined so that a sampling number per revolution of the motor is defined, and the defined number of samplings are performed regardless of the change in the rotational speed of the motor.

The FFT processing module 5 executes a frequency analysis while corresponding the group of time-series motor current data to the group of time-series speed data, and generates frequency spectra of the group of motor current data corresponding to the group of time-series speed data. In the data obtained through the frequency analysis (hereinafter, referred to as "three-dimensional (3D) frequency analysis data"), the group of time-series speed data correspond to the frequency spectra of the group of motor current data such that each time-series speed data corresponds to the frequency spectrum of each motor current data.

Then, in the 3D frequency analysis data, the amplitude of the gear frequency component of the motor current of the given gear in the specific frequency band fr increases by the resonance of the mechanical apparatus 11 including the reduction gear 13, and presents the peak value.

The gear frequency component acquiring module 6 extracts the gear frequency component of the motor current of a given order (here, first) from the 3D frequency analysis data, and acquires it. Here, the gear frequency component acquiring module 6 extracts the gear frequency component of the motor current of the given order, while successively calculating the frequency of the gear frequency component of the given order based on the rotational speed of the motor 14, according to the change in the rotational speed of the motor 14.

The specific-frequency-band component acquiring module 7 extracts a part existing in the given n-th specific frequency band frn from the gear frequency component of the motor current of the given order, and acquires it.

The amplitude peak value extracting module 8 extracts the amplitude peak value of the part of the gear frequency component of the motor current of the given order (here, the first gear frequency component) existing in the given n-th specific frequency band frn, and acquires it.

Operation

Figure 11:
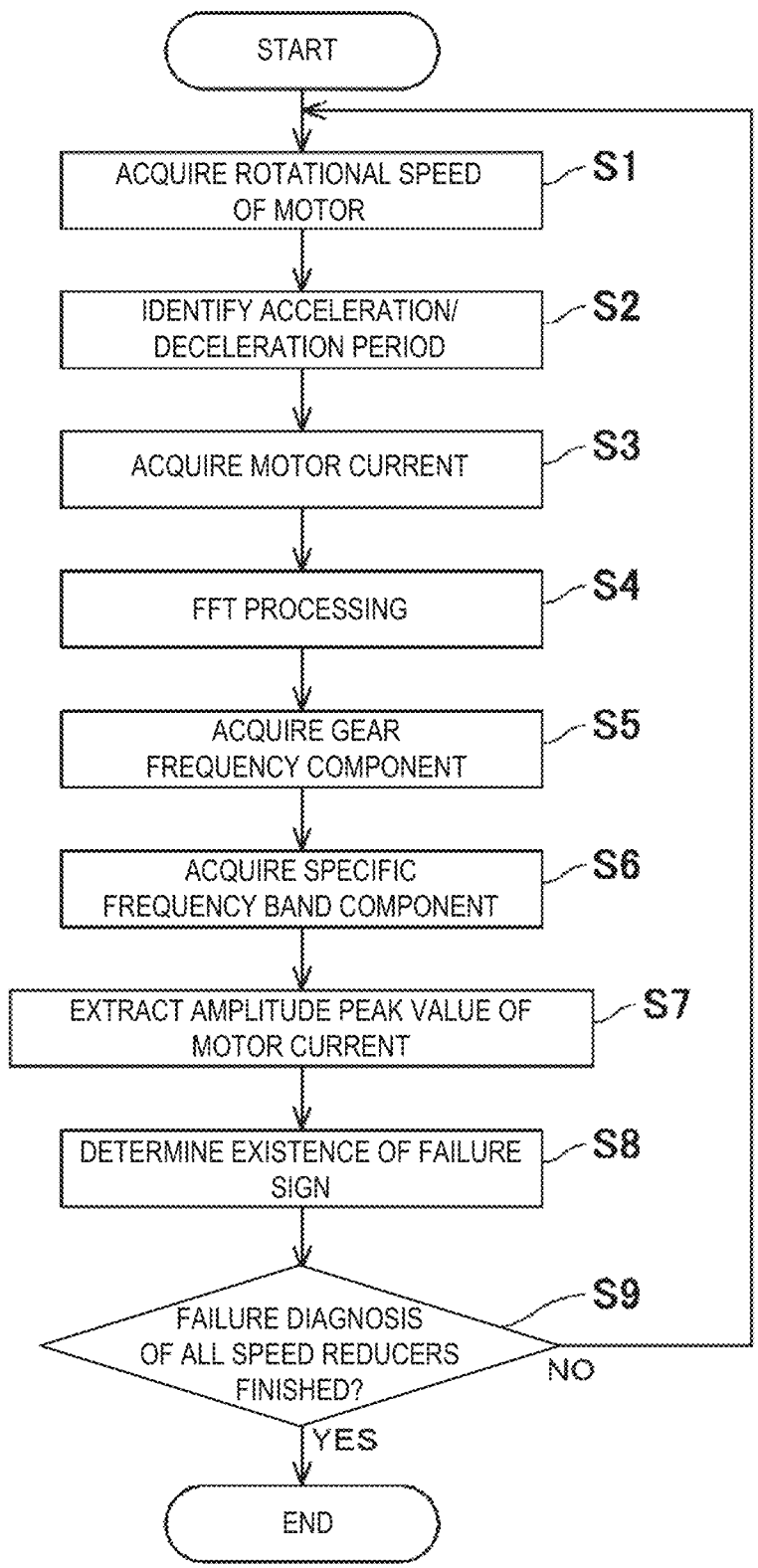
FIG. 11 is a flowchart illustrating one example of operation of the failure diagnosing device illustrated in FIG. 10.

Next, operation of the failure diagnosing device 1 with the above configuration is described. FIG. 11 is a flowchart illustrating one example of operation the failure diagnosing device 1 illustrated in FIG. 10. As described above, the operation of the failure diagnosing device 1 is implemented by the processor reading and executing the given failure diagnosis program stored in the memory. A target of the failure diagnosis is the plurality of reduction gears 13.

Referring to FIG. 11, in the failure diagnosing device 1, the speed acquiring module 2 acquires the rotational speed of the motor 14 for the first reduction gear 13, based on the data acquired from the controlling part 42 of the controller 17 (Step S1).

Next, the acceleration/deceleration period identifying module 3 identifies the acceleration/deceleration period of the operation part 12 of the mechanical apparatus 11 based on the rotational speed of the motor 14 (Step S2).

Next, the motor current acquiring module 4 acquires the motor current based on the data read from the controlling part 42 of the controller 17 (Step S3).

Next, the FFT processing module 5 generates the group of time-series speed data and the group of time-series motor current data based on the rotational speed and the motor current of the motor 14. Then, the FFT processing module 5 executes the frequency analysis while corresponding the group of time-series speed data to the group of time-series motor current data, and generates the 3D frequency analysis data where the group of time-series speed data correspond to the frequency spectra of the group of motor current data (Step S4).

Next, the gear frequency component acquiring module 6 extracts the gear frequency component of the motor current of the given order (here, first) from the 3D frequency analysis data, and acquires it (Step S5).

Next, the specific-frequency-band component acquiring module 7 extracts the part existing in the given n-th specific frequency band frn from the gear frequency component of the motor current of the given order, and acquires it (Step S6). Here, as the given n-th specific frequency band frn, the n-th specific frequency band frn which causes the oscillation of the mechanical apparatus 11 and facilitates the acquisition of the amplitude peak value of the gear frequency component of the given gear of the motor current, is used. For example, when the reduction gear 13 is the reduction gear 13 which drives the first joint JT1 of the robot body (41) in FIG. 4, the first specific frequency band fr1 is selected as the n-th specific frequency band frn.

Next, the amplitude peak value extracting module 8 extracts the amplitude peak value of the part existing in the given n-th specific frequency band frn, among the gear frequency components of the motor current of the given order, and acquires it (Step S7).

Next, the determining module 9 determines, based on the amplitude peak value, whether the sign of failure exists in the first reduction gear 13 (Step S8). Then, the output part 10 suitably outputs the determination result.

Next, the determining module 9 determines whether the failure diagnosis for all the reduction gears 13 is finished (Step S9). When the failure diagnosis for all the reduction gears 13 is not finished, processing is returned to Step S1 (NO at Step S9), and the failure diagnosing device 1 executes the failure diagnosis for the next reduction gear (Steps S1-S9). In this case, for example, when the reduction gear 13 is the reduction gear 13 which drives the second joint JT2 of the robot body (41) in FIG. 4, at Step S6, the second specific frequency band fr2 is selected as the n-th specific frequency band frn.

After that, the failure diagnosing device 1 repeats Steps S1-S9 until the failure diagnosis for all the reduction gears 13 is finished, and ends the failure diagnosis when the failure diagnosis for all the reduction gears 13 is finished (YES at Step S9).

As described above, according to Embodiment 1, in the mechanical apparatus 11 incorporating the plurality of reduction gears 13, the specific frequency band fr which causes the oscillation of the mechanical apparatus 11 and facilitates the acquisition of the amplitude peak value of the gear frequency component of the motor current of the gear, is selected according to the meshing direction of the given gear of each reduction gear 13, and thus, the detection sensitivity of the sign of failure improves. As a result, the existence of the sign of failure in the plurality of reduction gears 13 can be diagnosed at an early stage.

Embodiment 2

Figure 12:
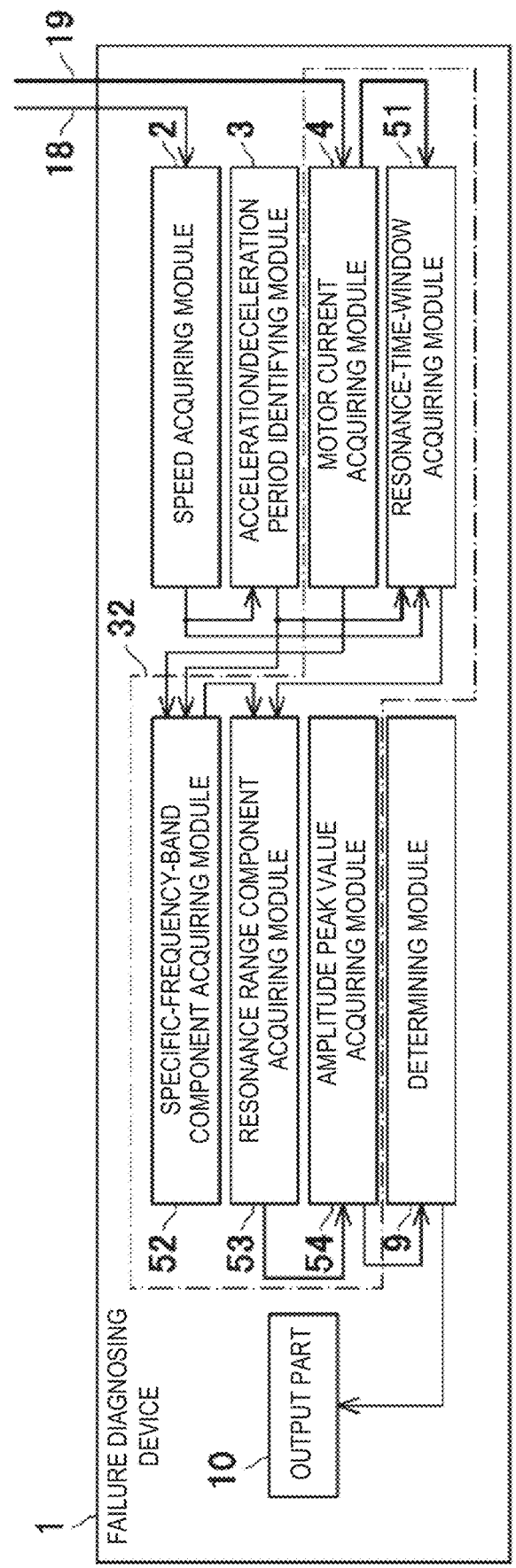
FIG. 12 is a functional block diagram illustrating one example of a configuration of a failure diagnosing device according to Embodiment 2 of the present disclosure.

FIG. 12 is a functional block diagram illustrating one example of a configuration of the failure diagnosing device 1 according to Embodiment 2 of the present disclosure.

In the failure diagnosing device 1 of Embodiment 2, a configuration of the motor current processing module 32 is different from the motor current processing module 32 of the failure diagnosing device 1 of Embodiment 1. Other configurations of the failure diagnosing device 1 of Embodiment 2 are the same as the configurations of the failure diagnosing device 1 of Embodiment 1. Below, the different points are described.

Referring to FIG. 12, in the failure diagnosing device 1 of Embodiment 2, the motor current processing module 32 includes a resonance-time-window acquiring module 51, a specific-frequency-band component acquiring module 52, a resonance range component acquiring module 53, and an amplitude peak value acquiring module 54.

The resonance-time-window acquiring module 51 acquires a time window during which the rotational speed of the given gear of the reduction gear 13 corresponding to the fundamental and the harmonic (a rotational speed of natural-number multiple of the rotational speed of the given gear) becomes the frequency in the n-th specific frequency band frn during the acceleration/deceleration period which is identified by the acceleration/deceleration period identifying module 3. Here, as described above, since the amplitude peak value of the first gear frequency component of the motor current is obtained, the "given order" is "first." That is, the "rotational speed of the given gear corresponding to the fundamental and the harmonic of the given gear" is the rotational speed of the given gear. The time window corresponds to a time window of the motor current during which the mechanical apparatus 11 resonates (hereinafter, referred to as a "resonance time window").

The specific-frequency-band component acquiring module 52 acquires the frequency components of the motor current over a part or all of the n-th specific frequency band frn by applying a band-pass filtering to the motor current.

The resonance range acquiring module 53 extracts a part existing in the resonance time window which is acquired by the resonance-time-window acquiring module 51, from the components of the motor current in the n-th specific frequency band frn which is acquired by the specific-frequency-band component acquiring module 52, and acquires it. The acquired component of the motor current corresponds to the frequency component of the motor current existing in a resonance range of the mechanical apparatus 11 (hereinafter, referred to as a "resonant frequency component").

The amplitude peak value acquiring module 54 calculates, for every resonance time window, an effective value of the resonant frequency component of the motor current which is acquired by the resonance range acquiring module 53, and obtains the maximum value as the amplitude peak value and acquires it.

Figure 13:
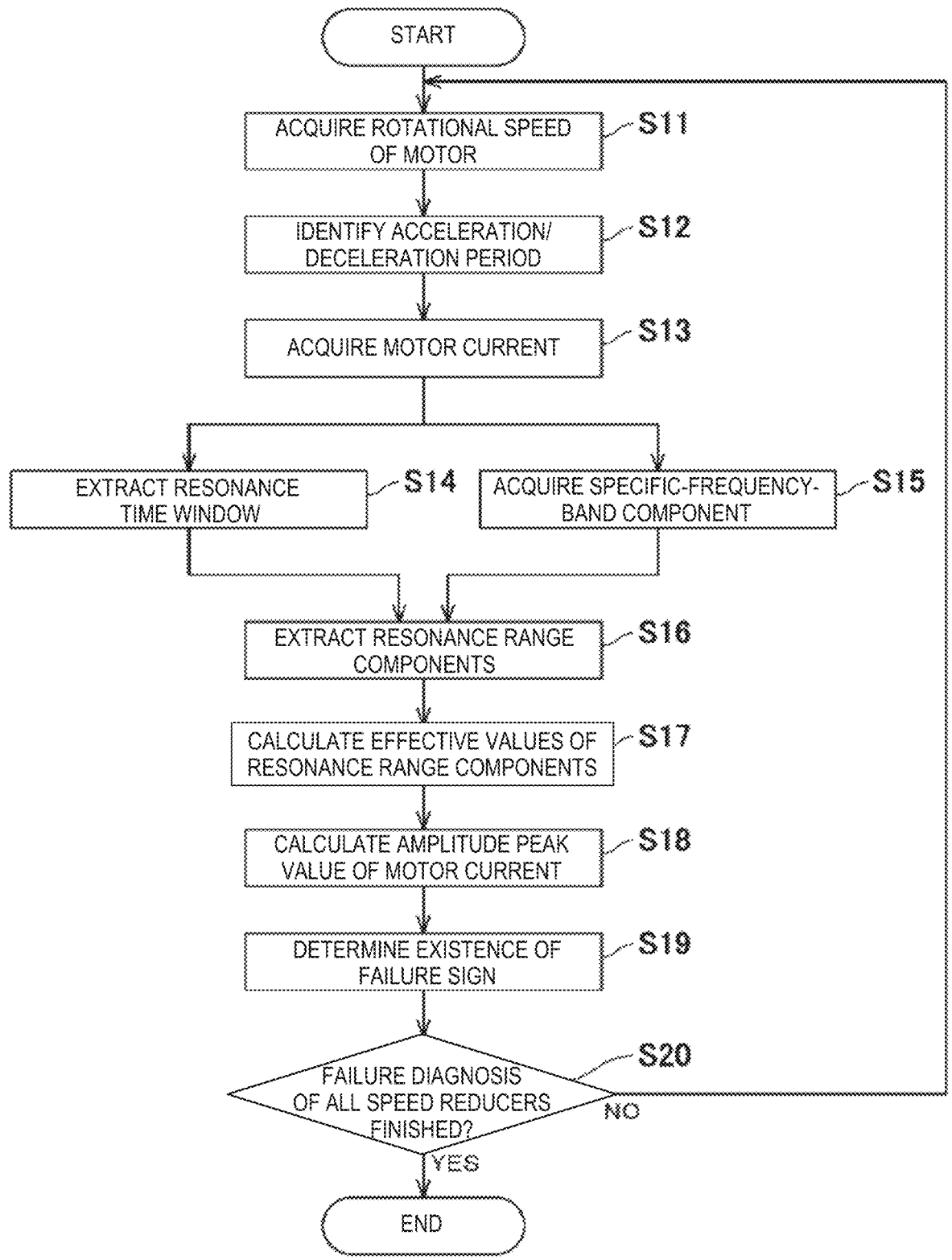
FIG. 13 is a flowchart illustrating one example of operation of the failure diagnosing device illustrated in FIG. 12.

Next, operation of the failure diagnosing device 1 with the above configuration is described in detail. FIG. 13 is a flowchart illustrating one example of the operation of the failure diagnosing device 1 illustrated in FIG. 12.

Referring to FIG. 13, Steps S11-S13 are the same as Steps S1-S3 for the operation of the failure diagnosing device 1 of Embodiment 1 illustrated in FIG. 11, and thus, description thereof is omitted.

In the failure diagnosing device 1, after the motor current acquiring module acquires the motor current, the resonance-time-window acquiring module 51 acquires the resonance time window during which the rotational speed of the given gear of the reduction gear 13 corresponding to the fundamental and the harmonic becomes the frequency in the n-th specific frequency band frn during the acceleration/deceleration period which is identified by the acceleration/deceleration period identifying module 3 (Step S14). Here, since the amplitude peak value of the first gear frequency component of the motor current is to be obtained, the "rotational speed of the given gear corresponding to the fundamental and the harmonic" is the rotational speed of the given gear. This is described with reference to FIG. 14.

Figure 14:
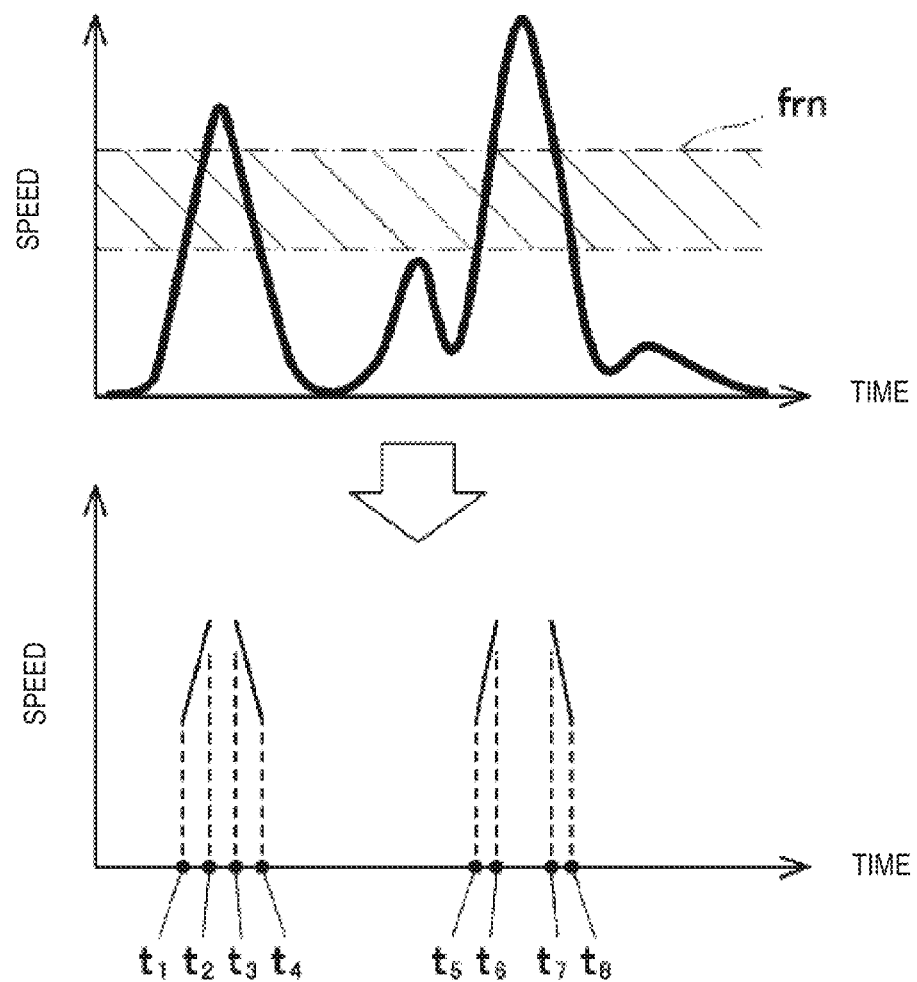
FIG. 14 illustrates graphs showing one example of a method of extracting a resonance time window illustrated in FIG. 13.

FIG. 14 is a graph illustrating one example of a method of extracting the resonance time window illustrated in FIG. 13. Referring to FIG. 14, as illustrated in an upper graph in FIG. 14, the resonance-time-window acquiring module 51 converts the rotational speed of the motor 14 to the rotational speed of the given gear, and generates time-series data of the converted rotational speed. Then, as illustrated in a lower graph in FIG. 14, a part where the converted rotational speed exists in the n-th specific frequency band frn is extracted from the time-series data of the converted rotational speed. Then, pairs of times $(t_1, t_2)$, $(t_3, t_4)$, $(t_5, t_6)$, and $(t_7, t_8)$ each corresponding to a start and an end of the extracted converted rotational speed, are extracted, and based on the pairs of times $(t_1, t_2)$, $(t_3, t_4)$, $(t_5, t_6)$, and $(t_7, t_8)$, the resonance time windows during which the converted rotational speed exists in the n-th specific frequency band frn, are obtained.

Figure 15:
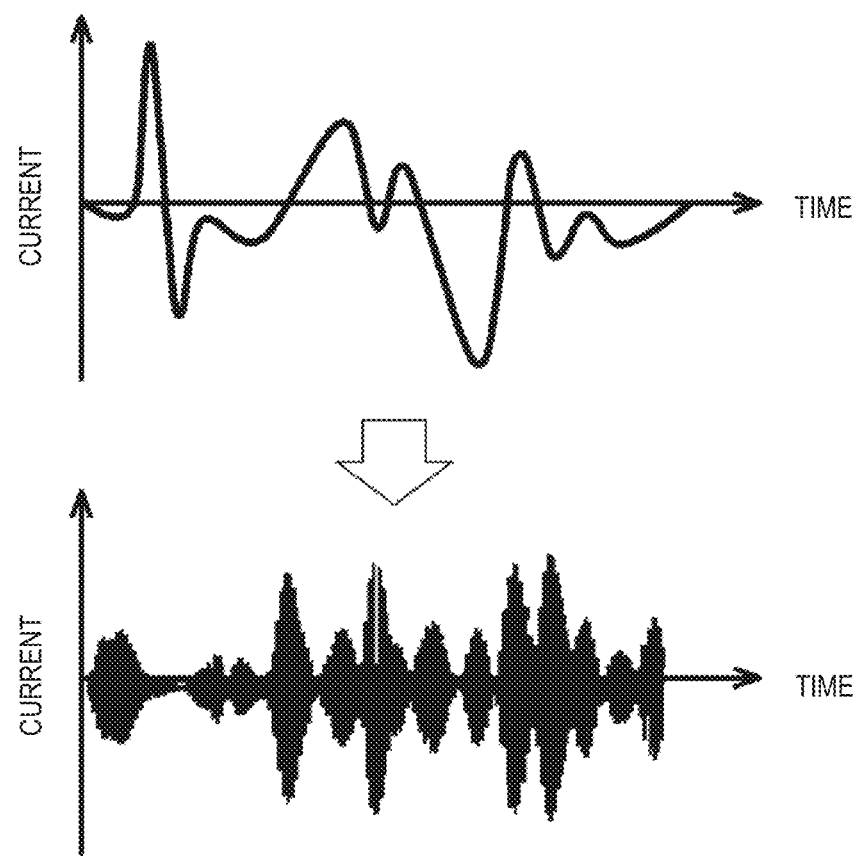
FIG. 15 illustrates graphs showing one example of a method of extracting a specific-frequency-band component of the motor current illustrated in FIG. 13.

On the other hand, parallel with this processing, the specific-frequency-band component acquiring module 52 acquires the frequency components of the motor current in the n-th specific frequency band frn, by applying the band-pass filtering to the motor current (Step S15). Here, although the frequency components of the motor current over the entire n-th specific frequency band frn is acquired, the frequency components of the motor current over a part of the n-th specific frequency band frn may be acquired. As the n-th specific frequency band frn, for example, when the reduction gear 13 is the reduction gear 13 which drives the first joint JT1 of the robot body (41) in FIG. 4, the first specific frequency band fr1 is selected, and when the reduction gear 13 is the reduction gear 13 which drives the second joint JT2, the second specific frequency band fr2 is selected. This is described with reference to FIG. 15. FIG. 15 illustrates graphs showing one example of a method of extracting the frequency components of the motor current in the n-th specific frequency band frn illustrated in FIG. 13.

Referring to FIG. 15, when the band-pass filtering having a pass band over the entire n-th specific frequency band frn is applied to the motor current illustrated in an upper graph, the frequency components of the motor current in the n-th specific frequency band frn as illustrated in a lower graph are obtained.

Figure 16:
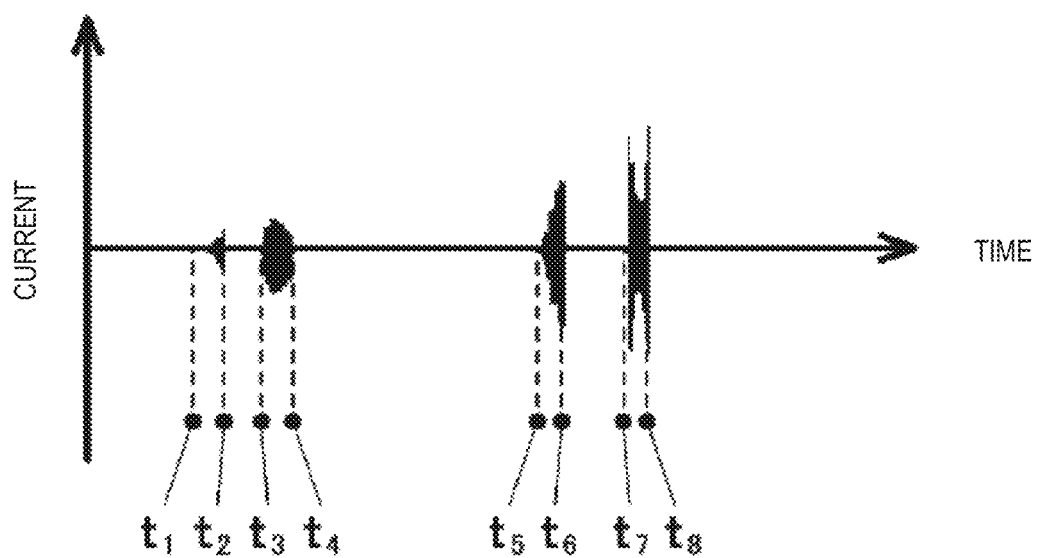
FIG. 16 is a graph illustrating one example of a method of extracting a resonance range component of the motor current illustrated in FIG. 13.

Then, the resonance range acquiring module 53 extracts a part existing in the resonance time windows which are acquired by the resonance-time-window acquiring module 51, from the frequency components of the motor current in the n-th specific frequency band frn which are acquired by the specific-frequency-band component acquiring module 52, and acquires it (Step S16). This is described with reference to FIG. 16. FIG. 16 is a graph illustrating one example of a method of extracting the resonance range components of the motor current illustrated in FIG. 13.

Referring to FIG. 16, the resonance range acquiring module 53 acquires a part (resonant frequency components) existing in the resonance time windows identified based on the pairs of times $(t_1, t_2)$, $(t_3, t_4)$, $(t_5, t_6)$, and $(t_7, t_8)$, among the frequency components of the motor current in the n-th specific frequency band frn illustrated in the lower graph in FIG. 15.

Figure 17:
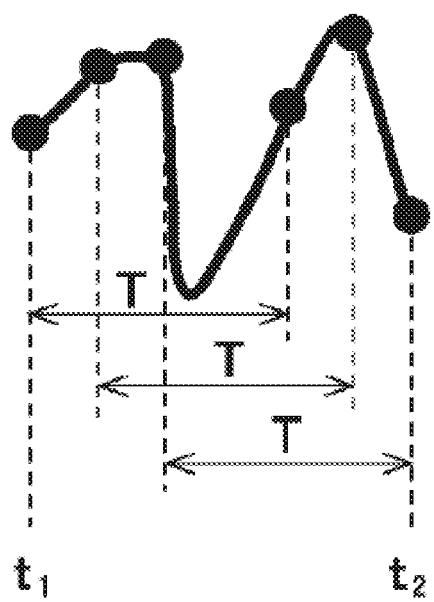
FIG. 17 is a graph illustrating one example of a method of calculating an effective value of the resonance range component of the motor current illustrated in FIG. 13.

Next, the amplitude peak value acquiring module 54 calculates effective values of the resonant frequency components of the motor current which are acquired by the resonance range acquiring module 53 for the respective resonance time windows, and obtains the maximum value as the amplitude peak value and acquires it (Step S17). This is described with reference to FIG. 17. FIG. 17 is a graph illustrating one example of a method of calculating the effective value of the resonance range component of the motor current illustrated in FIG. 13.

Referring to FIG. 17, the amplitude peak value acquiring module 54 acquires the effective value of the resonance range component of the motor current based on the following Formula 1.

$$A(t_0) = \sqrt{\frac{1}{T} \int_{t_0-T}^{t_0} a^2(t)dt} \quad (1)$$

In this formula, $\alpha(t)$ is an instantaneous value at a time t, and $A(t0)$ is an effective value at a time $t_0$, and T is a time constant. In FIG. 17, the method of obtaining the effective value of the resonance time window from the time $t_1$ to the time $t_2$ is described.

Next, the amplitude peak value acquiring module 54 obtains, as the amplitude peak value, the maximum value among the effective values of the resonant frequency components of the motor current which are calculated for the respective resonance time windows, and acquires it (Step S18).

Since the following Steps S19 and S20 are the same as Steps S8 to S9 in the operation of the failure diagnosing device 1 according to Embodiment 1 illustrated in FIG. 11, description thereof is omitted.

Next, a comparison between the failure diagnosis of Embodiment 1 using the FFT processing, and the failure diagnosis of Embodiment 2 using the band-pass filtering is described.

Figure 18:
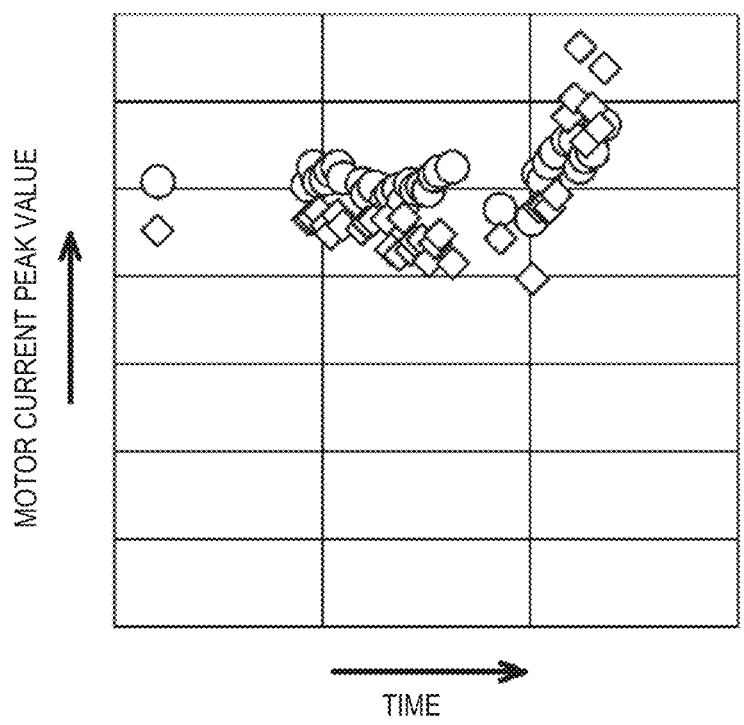
FIG. 18 is a graph illustrating a result of a wear acceleration test of the reduction gear of the robot illustrated in FIG. 4, while comparing an evaluation by an FFT analysis and an evaluation by a band-pass filtering.

FIG. 18 is a graph illustrating a result of a wear acceleration test of the reduction gear of the robot of FIG. 4, while comparing an evaluation by the FFT analysis and an evaluation by the band-pass filtering. An iron powder concentration in grease is used as an index of the degree of wear of the reduction gear.

In FIG. 18, the horizontal axis indicates a lapse time of the test, and the vertical axis indicates the amplitude peak value of the motor current. Further, in FIG. 18, square plots indicate the evaluation by the FFT processing, and the circle plots indicate the evaluation by the band-pass filtering. It is apparent based on FIG. 18 that the evaluation by the band-pass filtering is comparable to the evaluation by the FFT processing.

It is apparent from the above description that, according to Embodiment 2, similarly to Embodiment 1, by selecting the specific frequency band fr which causes the oscillation of the mechanical apparatus 11 and facilitates the acquisition of the amplitude peak value of the gear frequency component of the motor current of the given gear, the detection sensitivity of the sign of failure improves. As a result, the existence of the sign of failure in the plurality of reduction gears 13 can be diagnosed at an early stage. Further, the FFT analysis becomes unnecessary in the failure diagnosis.

It is apparent for the person skilled in the art that many improvements and other embodiments are possible from the above description. Therefore, the above description is to be interpreted only as illustration.

INDUSTRIAL APPLICABILITY

The device and the method for diagnosing failure of the reduction gear of the present disclosure is useful as a device and a method for diagnosing failure of a reduction gear, capable of determining at an early stage existence of a sign of failure.

What is claimed is:

1. A failure diagnosing device configured to diagnose failure of a plurality of reduction gears provided to a mechanical apparatus including a plurality of operation components, and a plurality of motors configured to drive the plurality of operation components, respectively, the plurality of reduction gears being configured to reduce speeds of rotational forces of the plurality of motors and transmit the reduced rotational forces to the plurality of operation components, respectively, the failure diagnosing device comprising:

acceleration/deceleration period identifying circuitry configured to identify an acceleration/deceleration period of operation of one component of the plurality of operation components;

motor current processing circuitry configured to process motor current to acquire a peak value of an amplitude of a frequency component of the motor current in a specific frequency band during the acceleration/deceleration period (hereinafter, referred to as "the amplitude peak value of the motor current"), the motor current being one of a load current of one of the motors configured to drive the one operation component and a current value having a correlation with the load current; and determining circuitry configured to determine, based on the amplitude peak value of the motor current, whether a sign of failure exists in one of the reduction gears configured to reduce the speed of the rotational force of the one motor and transmit the reduced rotational force to the one operation component, wherein the mechanical apparatus is provided with a plurality of natural frequencies, and one specific frequency band includes one of the natural frequencies at which the mechanical apparatus is oscillated by resonance in a meshing direction of a gear of the one reduction gear, and wherein the determination is performed for each of the plurality of reduction gears.

2. The failure diagnosing device of claim 1, wherein the plurality of reduction gears include an A reduction gear in which a gear meshes in an A-direction, and a B reduction gear in which a gear meshes in a B-direction different from the A-direction, wherein the plurality of natural frequencies include an A natural frequency at which the mechanical apparatus is oscillated by resonance in the meshing direction of the gear of the A reduction gear, and a B natural frequency at which the mechanical apparatus is oscillated by resonance in the meshing direction of the gear of the B reduction gear, and wherein the determining circuitry executes the determination by using an A specific frequency band including the A natural frequency for the A reduction gear, and using a B specific frequency band including the B natural frequency for the B reduction gear.

3. The failure diagnosing device of claim 1, wherein the determination includes a determination based on a comparison between the amplitude peak value of the motor current and a given amplitude threshold.

4. The failure diagnosing device of claim 1, wherein the mechanical apparatus is a vertical articulated robot, the plurality of operation components are a plurality of links and a plurality joints coupling the plurality of links of the robot, the plurality of motors are a plurality of motors configured to drive the plurality of joints, respectively, and the plurality of reduction gears are a plurality of reduction gears configured to reduce speeds of rotational forces of the plurality of motors and transmit the reduced rotational forces to the plurality of operation components, respectively.

5. The failure diagnosing device of claim 1, wherein the motor current processing circuitry includes:

FFT processing circuitry configured to generate, based on a rotational speed and the motor current of the one motor, three-dimensional frequency analysis data in which a group of time-series speed data correspond to frequency spectra of a group of motor current data, respectively;

gear frequency component acquiring circuitry configured to extract a frequency component of the motor current of the gear of the one reduction gear at a fundamental or a harmonic, from the three-dimensional frequency analysis data, and acquire the extracted frequency component;

specific-frequency-band component acquiring circuitry configured to extract a part existing in the specific frequency band, from the frequency component of the motor current of the gear at the fundamental or the harmonic, and acquire the extracted part; and amplitude peak value extracting circuitry configured to acquire the amplitude peak value of the motor current by extracting an amplitude peak value of the part of the frequency component of the motor current of the gear at the fundamental or the harmonic in the specific frequency band.

6. The failure diagnosing device of claim 1, wherein the motor current processing circuitry includes:

resonance-time-window acquiring circuitry configured to acquire a time window during which a rotational speed of the gear of the one reduction gear becomes a frequency in the specific frequency band during the acceleration/deceleration period;

specific-frequency-band component acquiring circuitry configured to apply a band-pass filtering to the motor current of the one motor to acquire a frequency component of the motor current over a part or all of the specific frequency band; and amplitude peak value acquiring circuitry configured to acquire the amplitude peak value of the motor current based on the time window acquired by the resonance-time-window acquiring circuitry, and the frequency component acquired by the specific-frequency-band component acquiring circuitry.

7. A method of diagnosing failure of a plurality of reduction gears provided to a mechanical apparatus including a plurality of operation components, and a plurality of motors configured to drive the plurality of operation components, respectively, the plurality of reduction gears being configured to reduce speeds of rotational forces of the plurality of motors and transmit the reduced rotational forces to the plurality of operation components, respectively, the method comprising the steps of:

identifying an acceleration/deceleration period of operation of one component of the plurality of operation components;

processing motor current to acquire a peak value of an amplitude of a frequency component of the motor current in a specific frequency band during the acceleration/deceleration period (hereinafter, referred to as "the amplitude peak value of the motor current"), the motor current being one of a load current of one of the motors configured to drive the one operation component and a current value having a correlation with the load current; and determining, based on the amplitude peak value of the motor current, whether a sign of failure exists in one of the reduction gears configured to reduce the speed of the rotational force of the one motor and transmit the reduced rotational force to the one operation component, wherein the mechanical apparatus is provided with a plurality of natural frequencies, and one specific frequency band includes one of the natural frequencies at which the mechanical apparatus is oscillated by resonance in a meshing direction of a gear of the one reduction gear, and wherein the determining is performed for each of the plurality of reduction gears.

8. The method of claim 7, wherein the plurality of reduction gears include an A reduction gear in which a gear meshes in an A-direction, and a B reduction gear in which a gear meshes in a B-direction different from the A-direction, wherein the plurality of natural frequencies include an A natural frequency at which the mechanical apparatus is oscillated by resonance in the meshing direction of the gear of the A reduction gear, and a B natural frequency at which the mechanical apparatus is oscillated by resonance in the meshing direction of the gear of the B reduction gear, and wherein the determining is performed for the A reduction gear by using an A specific frequency band including the A natural frequency, and is performed for the B reduction gear using a B specific frequency band including the B natural frequency.

9. The method of claim 7, wherein the determining includes determining based on a comparison between the amplitude peak value of the frequency component the motor current in the specific frequency band and a given amplitude threshold.

10. The method of claim 7, wherein the mechanical apparatus is a vertical articulated robot, the plurality of operation components are a plurality of links and a plurality joints coupling the plurality of links of the robot, and the plurality of motors are a plurality of motors configured to drive the plurality of joints, respectively and the plurality of reduction gears are a plurality of reduction gears configured to reduce speeds of rotational forces of the plurality of motors and transmit the reduced rotational forces to the plurality of operation components, respectively.

11. The method of claim 7, wherein the processing the motor current includes:

generating, based on a rotational speed and the motor current of the one motor, three-dimensional frequency analysis data in which a group of time-series speed data correspond to frequency spectra of a group of motor current data;

extracting a frequency component of the motor current of the gear of the one reduction gear at a fundamental or a harmonic, from the three-dimensional frequency analysis data, and acquiring the extracted frequency component;

extracting a part existing in the specific frequency band, from the frequency component of the motor current of the gear at the fundamental or the harmonic, and acquiring the extracted part; and acquiring the amplitude peak value of the motor current by extracting an amplitude peak value of the part of the frequency component of the motor current of the gear at the fundamental or the harmonic in the specific frequency band.

12. The method of claim 7, wherein the processing the motor current includes:

acquiring a time window during which a rotational speed of the gear of the one reduction gear becomes a frequency in the specific frequency band during the acceleration/deceleration period;

applying a band-pass filtering to the motor current of the one motor to acquire a frequency component of the motor current over a part or all of the specific frequency band; and acquiring the amplitude peak value of the motor current based on the time window acquired in the acquiring the time window, and the frequency component acquired in the applying a band-pass filtering.

* * * * *